US010453720B1

(12) United States Patent
Aburatani et al.

(10) Patent No.: US 10,453,720 B1
(45) Date of Patent: Oct. 22, 2019

(54) METHOD OF MANUFACTURING SEMICONDUCTOR DEVICE

(71) Applicant: KOKUSAI ELECTRIC CORPORATION, Tokyo (JP)

(72) Inventors: Yukinori Aburatani, Toyama (JP); Takashi Yahata, Toyama (JP); Tadashi Takasaki, Toyama (JP); Naofumi Ohashi, Toyama (JP); Shun Matsui, Toyama (JP); Keita Ichimura, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/136,543

(22) Filed: Sep. 20, 2018

(30) Foreign Application Priority Data

Jul. 26, 2018 (JP) .................................. 2018-139974

(51) Int. Cl.
*H01L 21/67* (2006.01)
*H01L 21/677* (2006.01)

(52) U.S. Cl.
CPC .. *H01L 21/67196* (2013.01); *H01L 21/67098* (2013.01); *H01L 21/67742* (2013.01)

(58) Field of Classification Search
CPC ........... H01L 21/68707; H01L 21/6719; H01L 21/67253; H01L 21/67271; H01L 21/67288; H01L 21/67; G01N 21/88
See application file for complete search history.

(56) References Cited

U.S. PATENT DOCUMENTS

| 8,267,634 | B2 * | 9/2012 | Bufano ............. H01L 21/67017 104/281 |
| 9,224,628 | B2 * | 12/2015 | Bufano ............. H01L 21/67017 |
| 9,870,964 | B1 | 1/2018 | Yoshino et al. |
| 9,875,920 | B1 * | 1/2018 | Mizuguchi .......... C23C 16/4583 |
| 10,132,757 | B2 * | 11/2018 | Okuno ............. H01L 21/67288 |
| 2002/0034886 | A1 * | 3/2002 | Kurita ............... H01L 21/67167 438/800 |
| 2010/0211203 | A1 | 8/2010 | Oka et al. |
| 2011/0150607 | A1 | 6/2011 | Hong et al. |

(Continued)

FOREIGN PATENT DOCUMENTS

JP 6270952 B1 1/2018

OTHER PUBLICATIONS

Taiwanese Office Action dated Jun. 24, 2019 for the Taiwanese Patent Application No. 107132945.

*Primary Examiner* — Gregory A Wilson
(74) *Attorney, Agent, or Firm* — Volpe and Koening, P.C.

(57) ABSTRACT

There is provided a technique that includes (a) performing a heating process on a substrate in a process chamber, (b) transferring the substrate between the process chamber and a load lock chamber connected to a vacuum transfer chamber by a transfer robot installed in the vacuum transfer chamber connected to the process chamber, and (c) reading transfer information corresponding to process information applied to the substrate from a memory device in which plural pieces of the process information on a process content of the substrate and plural pieces of the transfer information of the transfer robot corresponding to the plural pieces of the process information are recorded, and controlling the transfer robot to transfer the substrate based on the read transfer information.

18 Claims, 10 Drawing Sheets

(56) References Cited

U.S. PATENT DOCUMENTS

| | | | |
|---|---|---|---|
| 2013/0180448 A1* | 7/2013 | Sakaue | H01L 21/67739 118/696 |
| 2018/0033663 A1* | 2/2018 | Wakabayashi | H01L 21/6773 |
| 2018/0258533 A1* | 9/2018 | Liang | C23C 16/52 |

* cited by examiner

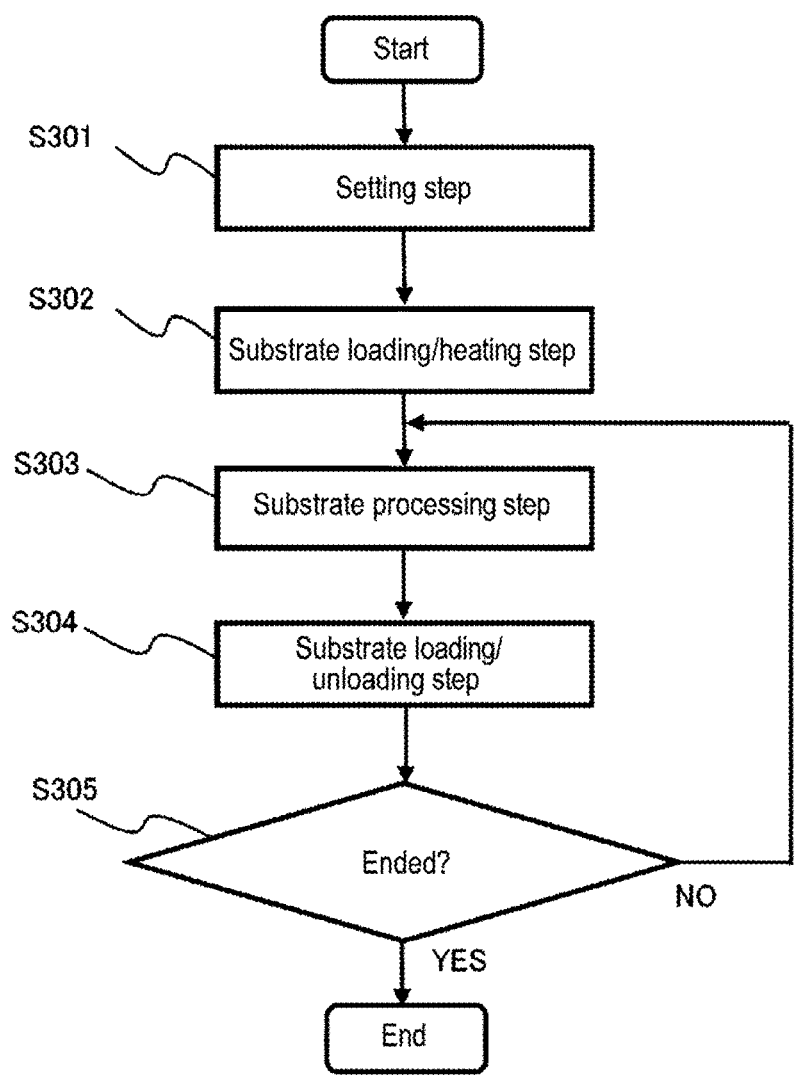

FIG. 9

| Process information (Process recipe) | Timing | Contact area (Arbitrary unit) | Transfer speed (Arbitrary unit) | Transfer information (Transfer recipe) |
|---|---|---|---|---|
| — | No substrate | 0 | 1 | No.1 |
| 150℃ SiO | Loading (before processing) | 1 | 0.8 | No.2 |
| | Unloading (after processing) | 0.98 | 0.75 | No.3 |
| 350℃ SiO | Loading (before processing) | 1 | 0.8 | No.2 |
| | Unloading (after processing) | 0.7 | 0.6 | No.4 |
| 350℃ SiO 2μm | Loading (before processing) | 1 | 0.8 | No.2 |
| | Unloading (after processing) | 0.6 | 0.5 | No.5 |
| 450℃ SiO | Loading (before processing) | 1 | 0.8 | No.2 |
| | Unloading (after processing) | 0.5 | 0.4 | No.6 |

FIG. 10

| Processing temperature [°C] | Heating time [Arbitrary unit] | Transfer information (Transfer recipe) |
|---|---|---|
| 150 | 10 | No.3 |
| 150 | 30 | No.3 |
| 350 | 5 | No.2 |
| 350 | 30 | No.4 |
| 450 | 5 | No.2 |
| 450 | 30 | No.6 |

US 10,453,720 B1

METHOD OF MANUFACTURING SEMICONDUCTOR DEVICE

CROSS-REFERENCE TO RELATED APPLICATION(S)

This application is based upon and claims the benefit of priority from Japanese Patent Application No. 2018-139974, filed on Jul. 26, 2018, the entire contents of which are incorporated herein by reference.

TECHNICAL FIELD

The present disclosure relates to a method of manufacturing a semiconductor device.

BACKGROUND

As a substrate processing apparatus used in a process of manufacturing a semiconductor device, there is, for example, an apparatus configured to load or unload a substrate by a transfer robot with respect to a process chamber for processing a substrate.

SUMMARY

The present disclosure provides some embodiments of a technique for realizing the proper transfer of a substrate by a transfer robot.

According to one embodiment of the present disclosure, there is provided a technique that includes: (a) performing a heating process on a substrate in a process chamber; (b) transferring the substrate between the process chamber and a load lock chamber connected to a vacuum transfer chamber by a transfer robot installed in the vacuum transfer chamber connected to the process chamber; and (c) reading transfer information corresponding to process information applied to the substrate from a memory device in which plural pieces of the process information on a process content of the substrate and plural pieces of the transfer information of the transfer robot corresponding to the plural pieces of the process information are recorded, and controlling the transfer robot to transfer the substrate based on the read transfer information.

BRIEF DESCRIPTION OF THE DRAWINGS

FIG. 8 is a flowchart of an outline of a substrate processing process according to one embodiment.

FIG. 9 is an explanatory diagram showing an example of a correspondence relationship between process information and transfer information in a first control mode of a vacuum transfer robot according to one embodiment.

FIG. 10 is an explanatory diagram showing an example of a correspondence relationship between a process recipe and transfer information in a second control mode of a vacuum transfer robot according to one embodiment.

DETAILED DESCRIPTION

One embodiment of the present disclosure will now be described in detail with reference to the drawings.

(1) Overall System Configuration of Substrate Processing Apparatus

Figure 1:
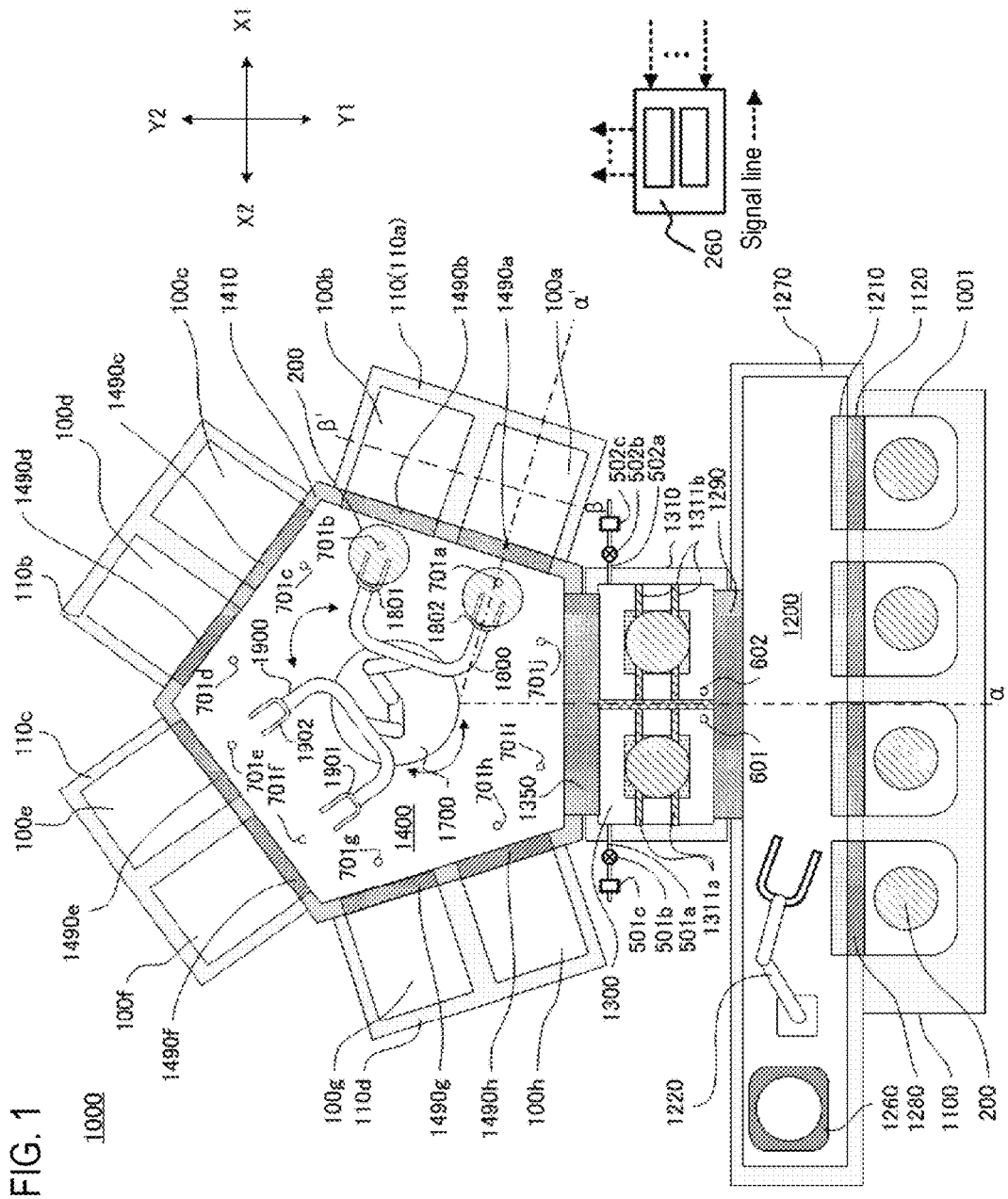
FIG. 1 is a schematic view of a horizontal cross section of an entire system of a substrate processing apparatus according to one embodiment.
Figure 2:
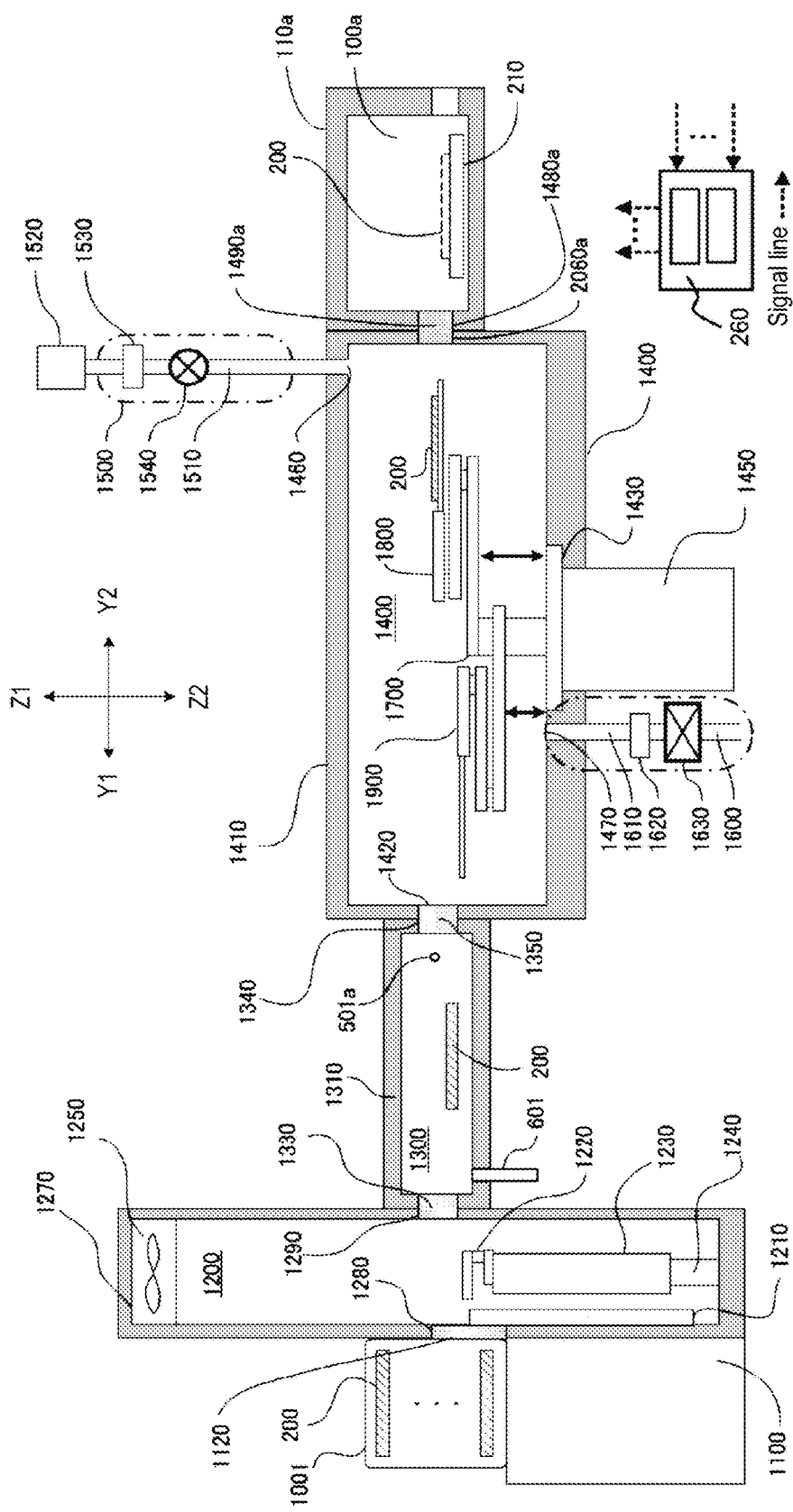
FIG. 2 is a schematic view of a vertical cross section of an entire system of a substrate processing apparatus according to one embodiment.
Figure 3:
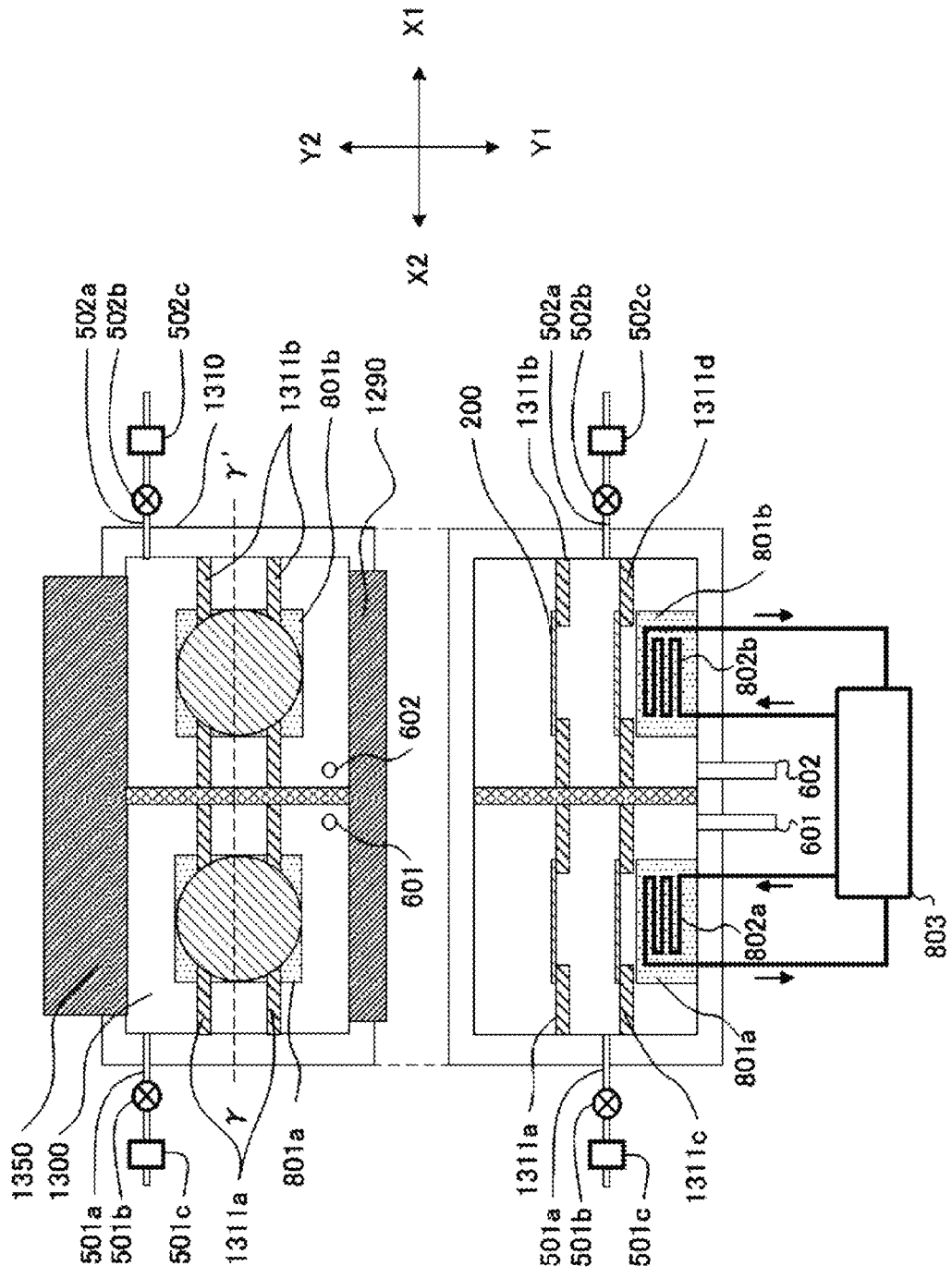
FIG. 3 is a schematic view of a cross section of a load lock chamber according to one embodiment.
Figure 4:
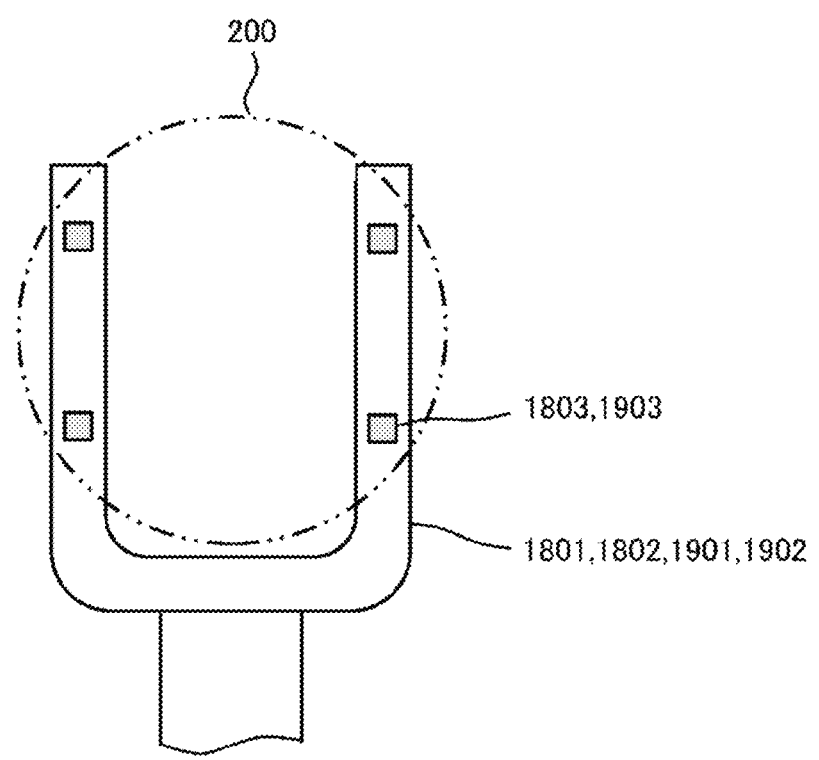
FIG. 4 is a schematic configuration view of tweezers of a vacuum transfer robot according to one embodiment.

First, an overall system configuration example of a substrate processing apparatus according to one embodiment will be described. FIG. 1 is a schematic view of a horizontal cross section of an overall system of a substrate processing apparatus according to the present embodiment. FIG. 2 is a schematic view of a vertical cross section of an overall system of a substrate processing apparatus according to one embodiment and is a vertical sectional view taken along line α-α' in FIG. 1. FIG. 3 is a schematic view of a cross section of a load lock chamber according to the present embodiment. FIG. 4 is a schematic configuration view of a tweezer of a vacuum transfer robot according to the present embodiment.

As shown in FIGS. 1 and 2, the overall system (hereinafter simply referred to as "substrate processing system") 1000 of a substrate processing apparatus to which the present disclosure is applied is configured to process a wafer 200 as a substrate and is mainly constituted by an IO stage 1100, an atmospheric transfer chamber 1200, a load lock chamber 1300, a vacuum transfer chamber 1400, a process module 110 and a controller 260.

The respective configurations will be specifically described below. In the following description, front, rear, left and right directions are indicated in the drawings, where an X1 direction is assumed to be right, the X2 direction is assumed to be left, the Y1 direction is assumed to be front, and the Y2 direction is assumed to be rear.

(Atmospheric Transfer Chamber & IO Stage)

An IO stage (load port) 1100 is installed at a front side of the substrate processing system 1000. On the IO stage 1100, a plurality of pods 1001 are mounted. The pods 1001 are used as carriers for transferring wafers 200 such as silicon (Si) substrates or the like and are configured to store a plurality of unprocessed wafers 200 or processed wafers 200.

A cap 1120 is installed in each of the pods 1001. The cap 1120 is opened and closed by a pod opener (PO) 1210. The PO 1210 opens and closes the cap 1120 of each of the pods 1001 mounted on the IO stage 1100, and opens and closes the substrate loading/unloading port, thereby making it possible to load and unload the wafers 200 into and from each of the pods 1001. The pods 1001 are supplied to and discharged from the IO stage 1100 by an in-process transfer device (RGV) (not shown).

The IO stage 1100 is adjacent to the atmospheric transfer chamber 1200. The load lock chamber 1300 (to be described later) is connected to a surface of the atmospheric transfer chamber 1200 other than a surface of the atmospheric transfer chamber 1200 where the IO stage 1100 is adjacent.

In the atmospheric transfer chamber 1200, an atmospheric transfer robot 1220 as a first transfer robot configured to transfer a wafer 200 is installed. As shown in FIG. 2, the atmospheric transfer robot 1220 is configured to be moved up and down by an elevator 1230 installed in the atmospheric transfer chamber 1200, and is also configured to be reciprocated in a left-right direction by a linear actuator 1240.

As shown in FIG. 2, a clean unit 1250 configured to supply a clean air is installed in the upper portion of the atmospheric transfer chamber 1200. As shown in FIG. 1, a device (pre-aligner) 1260 configured to align a notch or an orientation flat formed in each of the wafers 200 is installed at the left side of the atmospheric transfer chamber 1200.

As shown in FIGS. 1 and 2, first substrate loading/unloading ports 1280 through which the wafers 200 are loaded into and unloaded from the atmospheric transfer chamber 1200 and POs 1210 are installed on the front side of the housing 1270 of the atmospheric transfer chamber 1200. The IO stage 1100 is installed at the opposite side of the first substrate loading/unloading port 1280 from the POs 1210, i.e., at the outside of the housing 1270.

A second substrate loading/unloading port 1290, through which the wafers 200 are loaded into and unloaded from the load lock chamber 1300, is installed on the rear side of the housing 1270 of the atmospheric transfer chamber 1200. The second substrate loading/unloading port 1290 is opened and closed by a gate valve 1330, so that the wafers 200 can be loaded and unloaded.

(Load Lock Chamber)

Next, a load lock (hereinafter abbreviated as "L/L") chamber 1300 will be described with reference to FIGS. 1 to 3. The lower view in FIG. 3 is a sectional view taken along line γ-γ' in the upper view. The L/L chamber 1300 is adjacent to the atmospheric transfer chamber 1200. The vacuum transfer chamber 1400 to be described later is disposed on a surface of a housing 1310 of the L/L chamber 1300 other than a surface of the housing 1310 where the atmospheric transfer chamber 1200 is adjacent, among the surfaces of the housing 1310.

A substrate loading/unloading port 1340 is installed on the surface of the housing 1310, which is adjacent to the vacuum transfer chamber 1400. The substrate loading/unloading port 1340 is opened and closed by a gate valve (GV) 1350, so that the wafer 200 can be loaded and unloaded.

Further, support portions 1311a, 1311b, 1311c and 1311d on which wafers 200 are placed are installed in the L/L chamber 1300. The support portions 1311a and 1311b are configured to support unprocessed wafers 200, and the support portions 1311c and 1311d are configured to support processed wafers 200.

In addition, in the L/L chamber 1300, there are installed an inert gas supply part configured to supply an inert gas as a cooling gas into the L/L chamber 1300, and exhaust parts 601 and 602 configured to exhaust the atmosphere in the L/L chamber 1300. The inert gas supply part includes gas supply pipes 501a and 502a, valves 501b and 502b, and MFCs 501c and 502c, and is configured to adjust the flow rate of a cooling gas supplied into the L/L chamber 1300.

Cooling parts 801a and 801b are installed under the support parts 1311c and 1311d that support the processed wafers 200 so as to face the wafers 200. The cooling parts 801a and 801b have coolant passages 802a and 802b, and are configured such that a coolant is supplied from a chiller 803 to the coolant passages 802a and 802b. In this regard, for example, water ($H_2O$), perfluoropolyether (PFPE) or the like is used as the coolant.

(Vacuum Transfer Chamber)

As shown in FIGS. 1 and 2, the substrate processing system 1000 includes the vacuum transfer chamber (transfer module, hereinafter referred to as "TM") 1400 as a transfer chamber serving as a transfer space in which the wafers 200 are transferred under a negative pressure. A housing 1410 constituting the TM 1400 is formed in a pentagonal shape in a plan view. The L/L chamber 1300 and process modules 100 (110a to 110d) configured to process the wafers 200 are connected to the respective sides of the pentagon. Although there is shown an example in which the TM 1400 has a pentagonal shape, the TM 1400 may have a polygonal shape such as a quadrangular shape or a hexagonal shape.

A substrate loading/unloading port 1420 is installed on a side wall of a housing 1410 constituting the TM 1400, which is adjacent to the L/L chamber 1300, among the side walls of the housing 1410. The substrate loading/unloading port 1420 is opened and closed by a GV 1350, so that the wafer 200 can be loaded and unloaded.

A vacuum transfer robot 1700 as a second transfer robot that transfers (conveys) the wafers 200 under a negative pressure is installed at the substantially central portion of the TM 1400 using a flange 1430 as a base. Details of the vacuum transfer robot 1700 will be described later.

An inert gas supply hole 1460 configured to supply an inert gas into the housing 1410 is formed in the ceiling of the housing 1410 constituting the TM 1400. An inert gas supply pipe 1510 is connected to the inert gas supply hole 1460. In the inert gas supply pipe 1510, an inert gas source 1520, a mass flow controller (MFC) 1530 and a valve 1540 are installed sequentially from the upstream side so as to control a supply amount of the inert gas to be supplied into the housing 1410. An inert gas supply part 1500 in the TM 1400 is mainly constituted by the inert gas supply pipe 1510, the MFC 1530 and the valve 1540. The inert gas source 1520 and the gas supply hole 1460 may be included in the inert gas supply part 1500.

An exhaust hole 1470 configured to exhaust the atmosphere in the housing 1410 is formed in the bottom wall of the housing 1410 constituting the TM 1400. An exhaust pipe 1610 is connected to the exhaust hole 1470. An APC (Auto Pressure Controller) 1620 as a pressure controller and a pump 1630 are installed in the exhaust pipe 1610 sequentially from the upstream side. A gas exhaust part 1600 in the TM 1400 is mainly constituted by the exhaust pipe 1610 and the APC 1620. The pump 1630 and the exhaust hole 1470 may be included in the gas exhaust part.

In the TM 1400, the atmosphere in the housing 1410 is controlled by the cooperation of the inert gas supply part 1500 and the gas exhaust part 1600. For example, the pressure inside the housing 1410 is controlled.

(Vacuum Transfer Robot)

The vacuum transfer robot 1700 installed in the TM 1400 includes two arms 1800 and 1900. Each of the two arms 1800 and 1900 is provided with tweezers 1801, 1802, 1901 and 1902 on which the wafers 200 are mounted, and is configured to simultaneously transfer two wafers 200 with one arm.

In each of the tweezers 1801, 1802, 1901 and 1902, as shown in FIG. 4, pads 1803 and 1903 formed by, for example, carbon nanotubes are installed on a contact surface with the wafer 200. As a result, an anti-slip action is implemented with respect to the mounted wafer 200 using the van der Waals force by the pads 1803 and 1903. Incidentally, the arrangement position, the arrangement number and the like of the pads 1803 and 1903 are not particularly limited, and may be appropriately set.

As shown in FIG. 2, the vacuum transfer robot 1700 including the two arms 1800 and 1900 can be moved up and down by an elevator 1450 while maintaining the airtightness of the TM 1400 with a flange 1430. The elevator 1450 is configured to independently move up and down each of the arms 1800 and 1900 of the vacuum transfer robot 1700. Further, the elevator 1450 controls the moving up/down and rotation of the arms 1800 and 1900 of the vacuum transfer robot 1700. Thus, each of the arms 1800 and 1900 rotates about an arm axis or extends. By rotating or extending of each of the arms 1800 and 1900, the vacuum transfer robot 1700 can transfer the wafer 200 to the process modules 110 (110*a* to 110*d*), which will be described in detail later, and can unload the wafer 200 from the process modules 110 (110*a* to 110*d*).

(Process Module)

As shown in FIG. 1, process modules (hereinafter abbreviated as "PM") 110*a*, 110*b*, 110*c* and 110*d* configured to perform a desired process on the wafer 200 are connected to side walls of the housing 1410 of the TM 1400, on which the L/L chamber 1300 is not installed, among the side walls of the housing 1410.

In each of the PMs 110*a*, 110*b*, 110*c* and 110*d*, a plurality of chambers 100 constituting a main part of the substrate processing apparatus are installed. Specifically, chambers 100*a* and 100*b* are installed in the PM 110*a*, chambers 100*c* and 100*d* are installed in the PM 110*b*, chambers 100*e* and 100*f* are installed in the PM 110*c*, and chambers 100*g* and 100*h* are installed in the PM 110*d*.

A substrate loading/unloading port 1480 is formed in each of the side walls of the housing 1410 of the TM 1400, which faces each of the chambers 100. For example, as shown in FIG. 2, a substrate loading/unloading port 1480*a* is formed in the side wall facing the chamber 100*a*.

A gate valve (GV) 1490 is installed at each of the substrate loading/unloading ports 1480. That is, as shown in FIG. 1, the GV 1490 is installed for each chamber 100. Specifically, a GV 1490*a* is installed between the chamber 100*a* and the TM 1400, a GV 1490*b* is installed between the chamber 100*b* and the TM 1400, a GV 1490*c* is installed between the chamber 100*c* and the TM 1400, a GV 1490*d* is installed between the chamber 100*d* and the TM 1400, a GV 1490*e* is installed between the chamber 100*e* and TM 1400, a GV 1490*f* is installed between the chamber 100*f* and TM 1400, a GV 1490*g* is installed between the chamber 100*g* and TM 1400, and a GV 1490*h* is installed between the chamber 100*h* and TM 1400. Each substrate loading/unloading port 1480 is opened and closed by each GV 1490, so that the wafer 200 can be loaded and unloaded.

(Temperature Sensor)

Temperature sensors 701*a*, 701*b*, 701*c*, 701*d*, 701*e*, 701*f*, 701*g*, 701*h*, 701*i* and 701*j* are installed in the TM 1400, which communicates via the GVs 1350 and 1490 with the inside of the L/L chamber 300 and the inside of each chamber 100 of the PM 110, in the vicinity of the GVs 1350 and 1490. The temperature sensor is, for example, a radiation thermometer. By installing the temperature sensor in the TM 1400, it becomes possible to measure the temperature of the wafer 200 which is being transferred by the vacuum transfer robot 1700. It is also possible to measure the temperatures of the tweezers 1801, 1802, 1901 and 1902 of the respective arms 1800 and 1900 of the vacuum transfer robot 1700 in addition to the temperature of the wafer 200.

(2) Specific Configuration of the Chamber in the Substrate Processing Apparatus

Next, the chamber 100 in the PM 110, which is a part of the substrate processing apparatus according to one embodiment, will be described. Since the chambers 100*a* to 100*h* have the same configuration, they will be collectively referred to as a chamber 100 in the following description.

Figure 5:
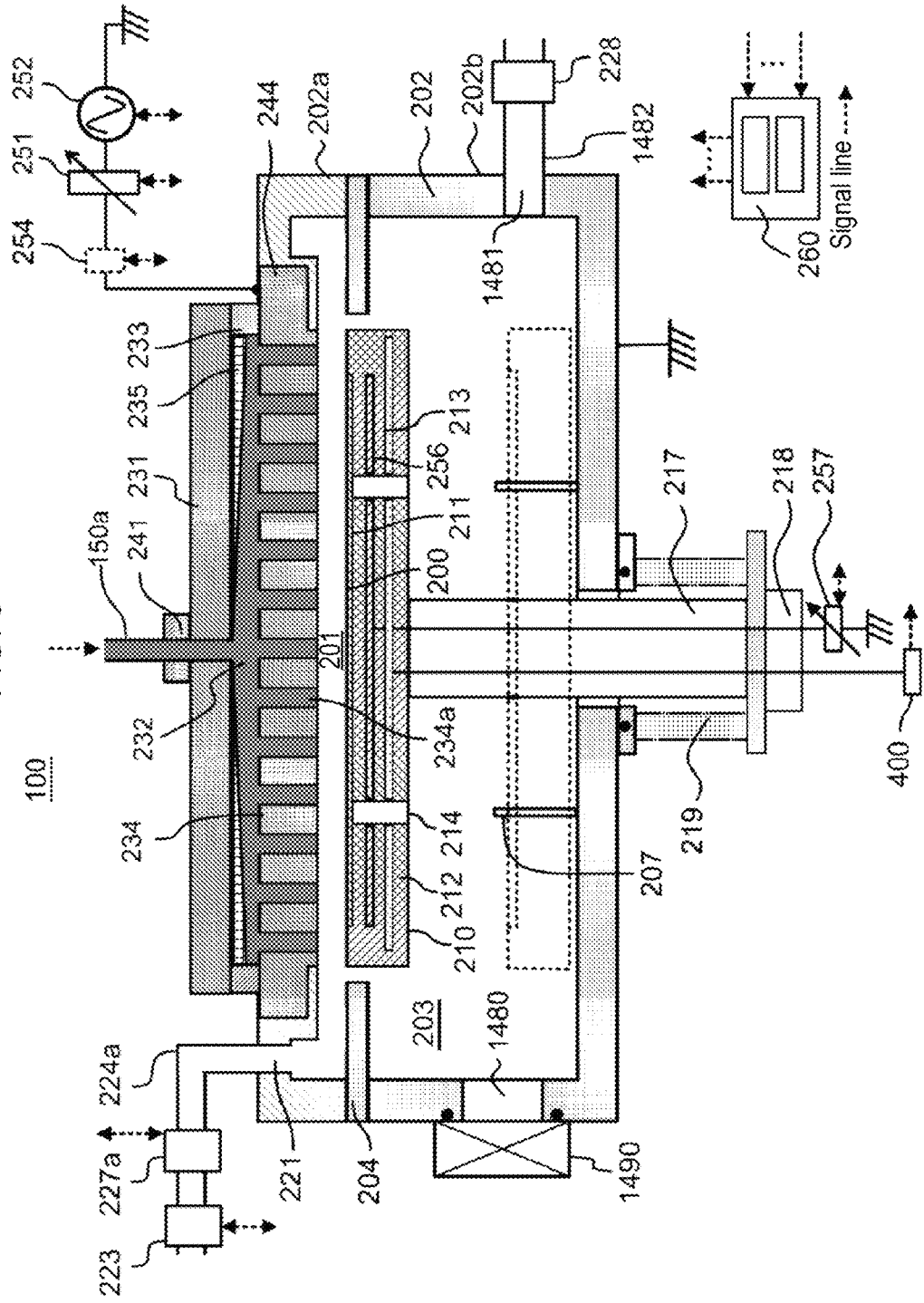
FIG. 5 is a schematic configuration view of a chamber in a process module according to one embodiment.
Figure 6:
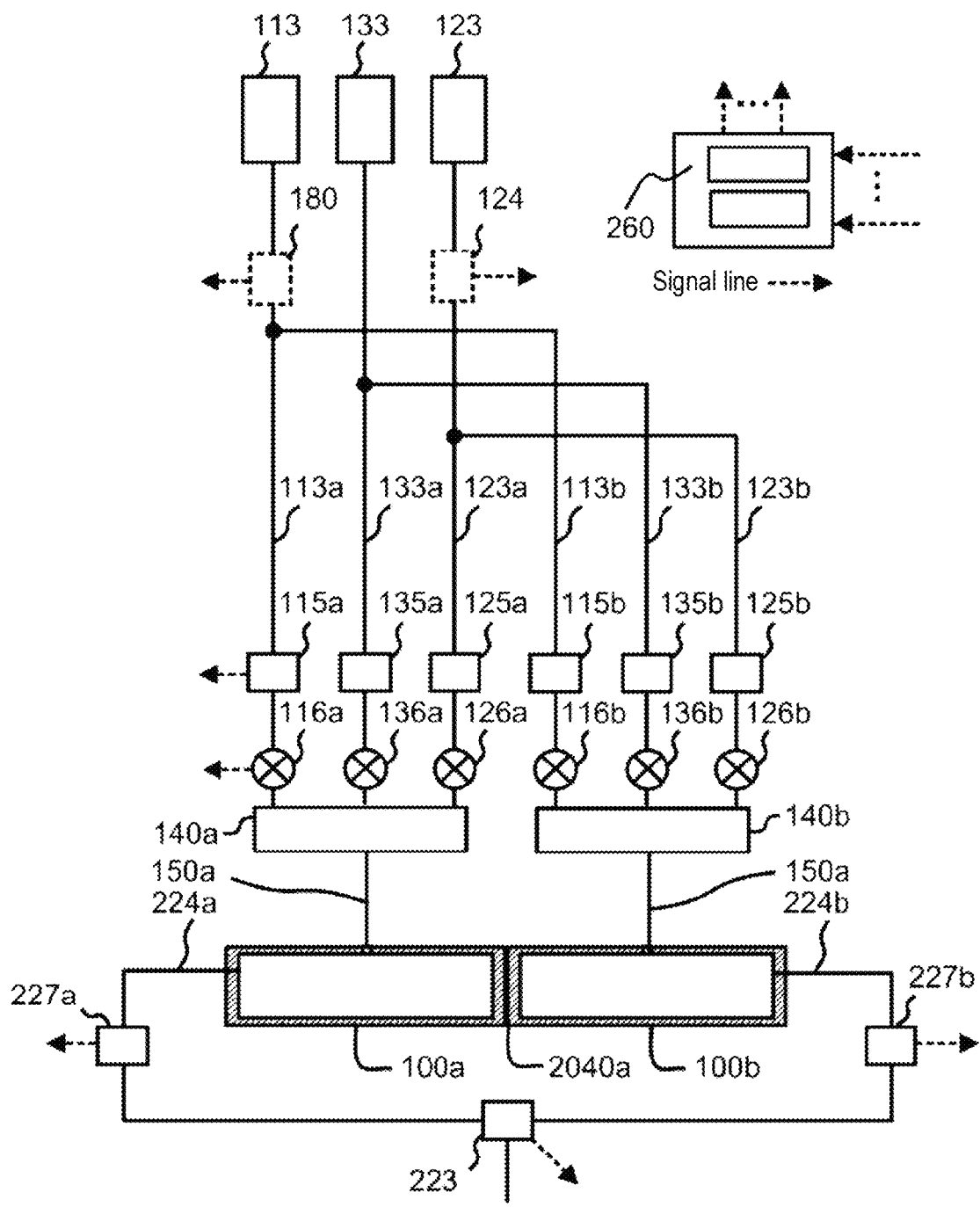
FIG. 6 is a schematic view of a gas supply system and a gas exhaust system of a process module according to one embodiment.

FIG. 5 is a schematic configuration view of the chamber in the process module according to the present embodiment. FIG. 6 is a schematic view of the gas supply system and the gas exhaust system of the process module according to the present embodiment and is a vertical sectional view taken along line β-β' in FIG. 1.

The chamber 100 is, for example, an insulating film-forming unit, and is configured as a single-substrate-type substrate processing apparatus as shown in FIG. 5. Hereinafter, a specific configuration of the chamber 100 will be described.

(Process Container)

The chamber 100 includes a process container 202. The process container 202 is configured as, for example, a flat closed container having a circular horizontal cross section. In addition, the process container 202 is made of a metallic material such as aluminum (Al) or stainless steel (SUS), or quartz. A process space (process chamber) 201, in which a wafer 200 as a substrate is processed, and a transfer space (transfer chamber) 203 are formed in the process container 202. The process container 202 is constituted by an upper container 202*a* and a lower container 202*b*. A partition portion 204 is installed between the upper container 202*a* and the lower container 202*b*. A space surrounded by the upper container 202*a* and disposed above the partition portion 204 is referred to as a process chamber 201. In addition, a space surrounded by the lower container 202*b* and disposed in the vicinity of the gate valve 1490 is referred to as a transfer chamber 203.

A substrate loading/unloading port 1480 adjacent to the gate valve 1490 is installed on the side surface of the lower container 202*b* so that the wafer 200 moves between the TM 1400 and the transfer chamber 203 via the substrate loading/unloading port 1480. A plurality of lift pins 207 is installed at the bottom of the lower container 202*b*. The lower container 202*b* is grounded.

A substrate support part 210 configured to support the wafer 200 is installed in the process chamber 201. The substrate support part 210 mainly includes a mounting surface 211 on which the wafer 200 is mounted, a substrate mounting table 212 having the mounting surface 211 on its front surface, and a heater 213 as a heating part. Through holes 214 through which the lift pins 207 penetrate are formed in the substrate mounting table 212 at the positions corresponding to the lift pins 207. In addition, the substrate mounting table 212 may be provided with a bias electrode 256 configured to apply a bias to the wafer 200 or the process chamber 201. A temperature measuring part 400 is connected to the heater 213, so that it can transmit the temperature information of the heater 213 to the controller 260. Further, the bias electrode 256 is connected to a bias adjustment part 257, so that the bias can be adjusted by the bias adjustment part 257. The setting information of the bias adjustment part 257 can be transmitted to and received from the controller 260.

The substrate mounting table 212 is supported by a shaft 217. The shaft 217 passes through the bottom portion of the process container 202 and is connected to an elevating part 218 outside the process container 202. By moving up and down the shaft 217 and the substrate mounting table 212 through the operation of the elevating part 218, the substrate mounting table 212 can move the wafer 200 mounted on the mounting surface 211 up and down. In addition, the periphery of the lower end portion of the shaft 217 is covered with a bellows 219, so that the interior of the process chamber 201 is airtightly kept.

When the wafer 200 is transferred, the substrate mounting table 212 is moved down to a position where the mounting surface 211 faces the substrate loading/unloading port 1480 (see a broken line in the figure). The position to which the substrate mounting table 212 is moved down is a wafer transfer position where the upper ends of the lift pins 207 protrude from the upper surface of the mounting surface 211. That is, when the substrate mounting table 212 moves to the wafer transfer position, the upper end portions of the lift pins 207 protrude from the upper surface of the mounting surface 211, so that the lift pins 207 support the wafer 200 from below. Since the lift pins 207 make direct contact with the wafer 200, it is desirable that the lift pins 207 are made of a material such as, for example, quartz or alumina. When processing the wafer 200, the substrate mounting table 212 is moved up to a position where the wafer 200 on the mounting surface 211 faces the process chamber 201 (see a solid line in the figure). The position to which the substrate mounting table 212 is moved up is a wafer processing position at which the wafer 200 is processed.

(Exhaust System)

A first exhaust port 221 as a first exhaust part configured to exhaust the atmosphere of the process chamber 201 is installed on the side surface of the inner wall of the process chamber 201 (upper container 202a). An exhaust pipe 224a is connected to the first exhaust port 221. A pressure regulator 227a such as an APC or the like for controlling the internal pressure of the process chamber 201 to a predetermined pressure and a vacuum pump 223 are sequentially connected to the exhaust pipe 224a in series. A first exhaust system (exhaust line) is mainly constituted by the first exhaust port 221, the exhaust pipe 224a and the pressure regulator 227a. The vacuum pump 223 may be included in the first exhaust system.

A second exhaust port 1481 configured to exhaust the atmosphere of the transfer chamber 203 is installed on the side surface of the inner wall of the transfer chamber 203. An exhaust pipe 1482 is connected to the second exhaust port 1481. A pressure regulator 228 is installed on the exhaust pipe 1482 so that the interior of the transfer chamber 203 can be exhausted to a predetermined pressure. Further, the internal atmosphere of the process chamber 201 may also be exhausted via the transfer chamber 203. Moreover, the pressure regulator 227a is configured to transmit and receive the pressure information and the valve opening degree information to and from the controller 260. In addition, the vacuum pump 223 is configured to transmit the ON/OFF information of the pump, the load information and the like to the controller 260.

(Gas Distribution Unit)

A shower head 234 as a gas distribution unit is installed on the upper portion (upstream side) of the process chamber 201. A gas introduction port 241 configured to supply various gases into the process chamber 201 is installed on the upper surface (ceiling wall) of the shower head 234. The configuration of each gas supply unit connected to the gas introduction port 241 as a gas supply unit will be described later.

The shower head 234 as a gas distribution unit includes a buffer chamber 232 and a first electrode 244 as a first activation part. The first electrode 244 is provided with a plurality of holes 234a for distributing and supplying a gas to the wafer 200. The shower head 234 is installed between the gas introduction port 241 and the process chamber 201. The gas introduced from the gas introduction port 241 is supplied to the buffer chamber 232 (distribution portion) of the shower head 234, and is supplied to the process chamber 201 via the holes 234a.

The first electrode 244 is made of a conductive metal and is configured as a part of an activation part (excitation part) for exciting a gas. Electromagnetic waves (high frequency power, microwaves, etc.) can be supplied to the first electrode 244. In addition, when a lid 231 is formed of an electrically conductive member, an insulating block 233 is installed between the lid 231 and the first electrode 244 so as to provide insulation between the lid 231 and the first electrode 244.

A gas guide 235 may be installed in the buffer chamber 232. The gas guide 235 has a conical shape so that the diameter thereof grows larger as the gas guide 235 extends from the gas introduction port 241 in a radial direction of the wafer 200. The horizontal diameter of the lower end of the gas guide 235 is formed so as to extend further to the outer periphery beyond the end portion of the region where the holes 234a are formed. By installing the gas guide 235, it is possible to uniformly supply the gas to each of the holes 234a and to make the amount of active species supplied to the plane of the wafer 200 uniform.

(Activation Part (Plasma Generation Part))

A matcher 251 and a high-frequency power supply part 252 are connected to the electrode 244 as an activation part and are configured to supply electromagnetic waves (high-frequency power, microwaves, etc.). As a result, the gas supplied into the process chamber 201 can be activated. In addition, the electrode 244 is configured to generate capacitively coupled plasma. Specifically, the electrode 244 is formed in a conductive plate shape and is configured to be supported by the upper container 202a. The activation part is constituted by at least the electrode 244, the matcher 251 and the high-frequency power supply part 252. An impedance meter 254 may be included in the activation part. In addition, an impedance meter 254 may be installed between the first electrode 244 and the high-frequency power supply part 252. By installing the impedance meter 254, it is possible to feedback-control the matcher 251 and the high-frequency power supply part 252 based on the measured impedance. Further, the high-frequency power supply part 252 is configured to transmit and receive power setting information to and from the controller 260, the matcher 251 is configured to transmit and receive matching information (traveling wave data and reflected wave data) to and from the controller 260, and the impedance meter 254 is configured to transmit and receive impedance information to and from the controller 260.

(Gas Supply System)

A gas supply pipe 150a is connected to the gas introduction port 241 installed on the upper surface of the shower head 234. From the gas supply pipe 150a, a first gas, a second gas and a purge gas, which will be described later, are supplied. The first gas is supplied by a first gas supply part (process gas supply part), the second gas is supplied by a second gas supply part (reaction gas supply part), and the purge gas is supplied by a third gas supply part (purge gas supply part).

As shown in FIG. 6, in the PM 110a provided with a chamber 100a to which the gas supply pipe 150a is connected, a chamber 100b is installed in addition to the chamber 100a. The respective chambers 100a and 100b are configured such that the atmospheres thereof are prevented from being mixed with each other by a partition wall 2040a installed therebetween. The first gas, the second gas and the purge gas are supplied not only to the chamber 100a but also to the chamber 100*b*. The same structure is applied to the PM 110*b*, the PM 110*c* and the PM 110*d*. That is, the same structure is used in the chambers 100*a* to 100*h* installed in the PM 110*b*, the PM 110*c* and the PM 110*d*. Therefore, in the following description, the gas supply system connected to the gas introduction port 241 of the chamber 100*a* will be described, and the description of other chambers 100*b* to 100*h* will be omitted.

A gas supply pipe collection part 140*a* is connected to the gas supply pipe 150*a* connected to the gas introduction port 241 of the chamber 100*a*. A first gas (process gas) supply pipe 113*a*, a purge gas supply pipe 133*a* and a second gas (process gas) supply pipe 123*a* are connected to the gas supply pipe collection part 140*a*.

(First Gas Supply Part)

A first gas supply pipe 113*a*, an MFC 115*a* and a valve 116*a* are installed in the first gas supply part. A first gas supply source 113 connected to the first gas supply pipe 113*a* may be included in the first gas supply part. Further, in the case where the precursor of a process gas is liquid or solid, a vaporizer 180 may be installed.

(Second Gas Supply Part)

A second gas supply pipe 123*a*, an MFC 125*a* and a valve 126*a* are installed in the first gas supply part. A second gas supply source 123 connected to the second gas supply pipe 123*a* may be included in the second gas supply part. A remote plasma unit (RPU) 124 may be installed to activate the second gas.

(Purge Gas Supply Part)

A purge gas supply pipe 133*a*, an MFC 135*a* and a valve 136*a* are installed in the first gas supply part. A purge gas supply source 133 connected to the purge gas supply pipe 133*a* may be included in the purge gas supply part.

Figure 7:
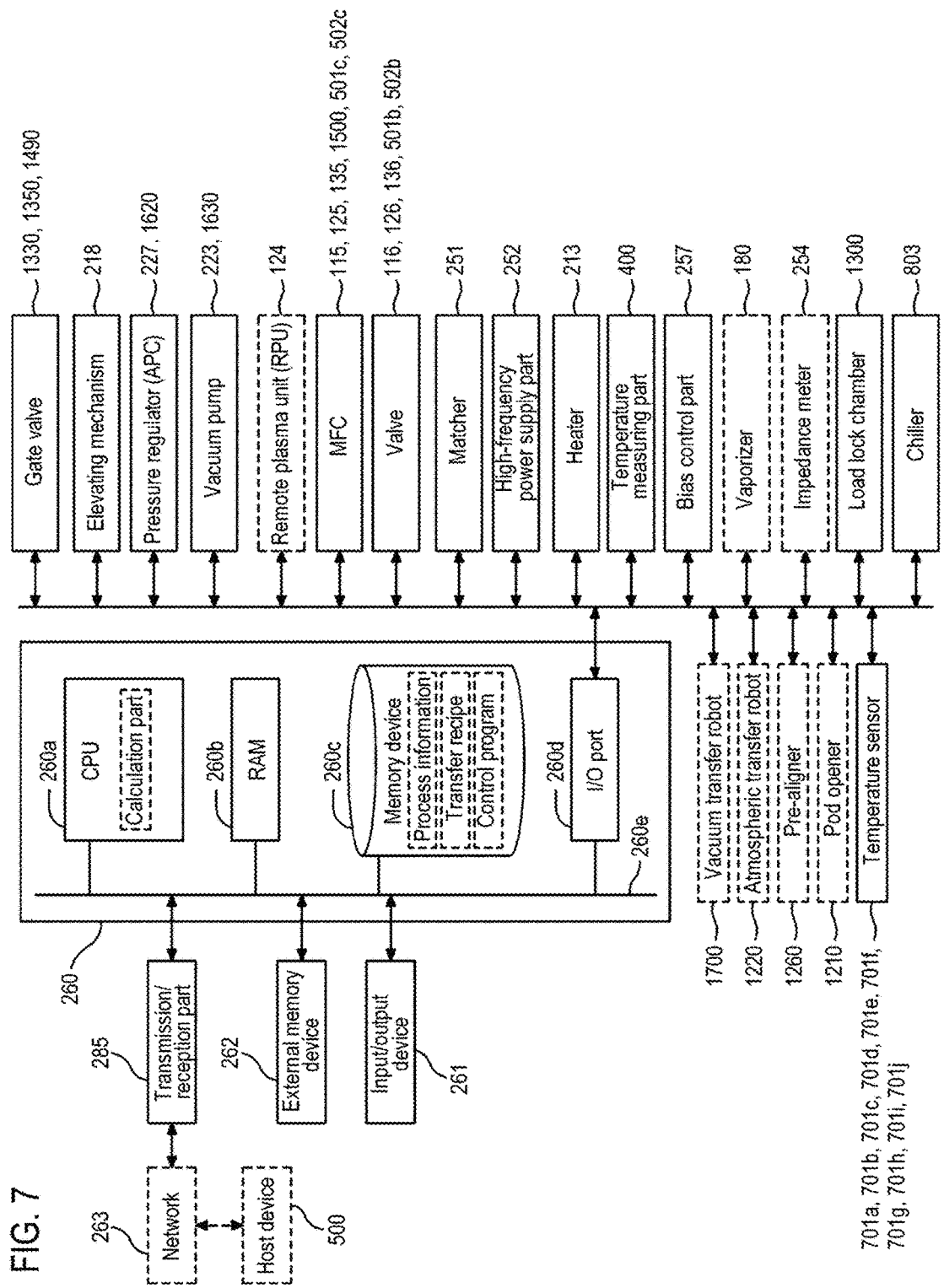
FIG. 7 is a schematic configuration diagram of a controller according to one embodiment.

(3) Specific Configuration of the Controller in the Substrate Processing Apparatus Next, the controller 260 which is a part of the substrate processing apparatus according to one embodiment will be described. FIG. 7 is a schematic configuration view of the controller according to the present embodiment.

(Hardware Configuration)

The controller 260 functions as a control part (control means) that controls the operation of each part of the substrate processing apparatus 100. Thus, the controller 260 is configured as a computer including a CPU (Central Processing Unit) 260*a*, a RAM (Random Access Memory) 260*b*, a memory device 260*c* and an I/O port 260*d*. The RAM 260*b*, the memory device 260*c* and the I/O port 260*d* are configured to exchange data with the CPU 260*a* via an internal bus 260*e*.

An input/output device 261 configured as, for example, a touch panel or the like, an external memory device 262, a transmission/reception part 285 and the like are connectable to the controller 260. By the connection with the transmission/reception part 285, the controller 260 may be connected to a host device 500 existing on a network 263.

The memory device 260*c* is composed of, for example, a flash memory, a HDD (Hard Disk Drive) and the like. A control program for controlling the operation of the substrate processing apparatus, process information which will be described in detail later, transfer information which will also be described in detail later, and the like are readably stored in the memory device 260*c*.

The RAM 260*b* is configured as a memory area (work area) in which the control program read by the CPU 260*a*, various kinds of information, various kinds of data and the like are temporarily held.

The I/O port 260*d* is connected to the gate valves 1330, 1350 and 1490, the elevating part 218, the heater 213, the pressure regulators 227 and 1620, the vacuum pumps 223 (223*a*, 223*b*, 223*c* and 223*d*) and 1630, the matcher 251, the high-frequency power supply part 252, the MFCs 115 (115*a*, 115*b*, 115*c* and 115*d*), 125 (125*a*, 125*b*, 125*c* and 125*d*), 135 (135*a*, 135*b*, 135*c* and 135*d*), 1530, 501*c*, 502*c*, the valves 116 (116*a*, 116*b*, 116*c* and 116*d*), 126 (126*a*, 126*b*, 126*c* and 126*d*), 136 (136*a*, 136*b*, 136*c* and 136*d*), 228, 1540, 502*a* and 502*b*, the RPU 124, the vaporizer 180), the bias adjustment part 257, the vacuum transfer robot 1700, the atmospheric transfer robot 1220, the chiller 803 and the like. The I/O port 260*d* may also be connected to the impedance meter 254 and the like.

The CPU 260*a* serving as an operation part is configured to read the control program from the memory device 260*c* and to execute the control program. The CPU 260*a* is also configured to read the process information from the memory device 260*c* in response to an input of an operation command or the like from the input/output device 261 and to read the transfer information corresponding to the process information from the memory device 260*c*. The CPU 260*a* is configured to, according to the content of the process information and the transfer information thus read, control the opening/closing operation of the gate valve 1490, the elevating operation of the elevating part 218, the operation of supplying power to the heater 213, the pressure regulation operation of the pressure regulators 227 and 228, the on/off control of the vacuum pump 223, the gas flow control operation at the MFCs 115, 125, 135, 145, 155, 501*c* and 502*c*, the gas activation operation of the RPU 124, 144 and 154, the on/off control of gases at the valves 116, 126, 136, 237, 146, 156, 502*a* and 502*b*, the power matching operation of the matcher 251, the power control operation of the high-frequency power supply part 252, the control operation of the bias adjustment part 257, the matching operation of the matcher 251 based on the measurement data measured by the impedance meter 254, and the like.

(Process Information)

The process information stored in the memory device 260*c* is information that defines the process content for the wafer 200 in the chamber 100*a*. More specifically, the process information includes at least a process recipe in which procedures, conditions and the like of substrate processing are written. The process recipe is a combination capable of obtaining a predetermined result by allowing the controller 260 to execute the respective procedures of a substrate processing process which will be described later, and defines the processing temperature, the heating time and the like at the time of performing a process on the wafer 200. The process information may include not only the process recipe but also the information on the productivities of a device manufactured using the wafer 200, such as a film type and a film thickness of a film to be formed on the wafer 200.

The memory device 260*c* is configured to record plural pieces of process information. When the plural pieces of process information are recorded in the memory device 260*c*, the CPU 260*a* serving as an operation part selectively reads one kind of process information to be applied to the wafer 200 as a processing target from the plural pieces of process information in response to the input of an operation command from the input/output device 261.

(Transfer Information)

The transfer information stored in the memory device 260*c* is information that defines operation conditions of the vacuum transfer robot 1700 installed in the TM 1400. More specifically, the transfer information includes at least a transfer recipe in which parameters such as a transfer speed and acceleration when the vacuum transfer robot 1700 transfers the wafer 200, a turning condition when turning the arms 1800 and 1900 and the like are written. The transfer information may include not only the transfer recipe but also the information that defines other conditions.

The memory device 260c is configured to be able to record plural pieces of transfer information and record the correspondence relationship between the transfer information and the process information. When plural pieces of transfer information are recorded in the memory device 260c, the CPU 260a serving as an operation part selectively reads one piece of transfer information corresponding to the read process information from the plural pieces of transfer information, based on the correspondence relationship between the transfer information and the process information.

(Program)

Each of the control program, the process information and the transfer information stored in the memory device 260c functions as a program to be executed by the CPU 260a as an operation part. Hereinafter, the control program, the process information, the transfer information, and the like are collectively and simply referred to as a program. The term program used herein may indicate a case of including only the control program, a case of including only the process information, a case of including only the transfer information, or a case of including a combination thereof.

The controller 260 is not limited to a case where it is configured as a dedicated computer, but may be configured as a general-purpose computer. For example, the controller 260 according to the present embodiment may be configured by preparing an external memory device (for example, a magnetic tape, a magnetic disk such as a flexible disk, a hard disk or the like, an optical disk such as a CD, a DVD or the like, a magneto-optical disk such as an MO or the like, or a semiconductor memory such as a USB memory, a memory card or the like) 262 which stores the aforementioned program and installing the program in a general-purpose computer using the external memory device 262. The means for supplying the program to the computer is not limited to the case where the program is supplied via the external memory device 262. For example, the program may be supplied by using a communication means such as the transmission/reception part 285 and the network 263 (the Internet or a dedicated line) without using the external memory device 262. The memory device 260c or the external memory device 262 is configured as a non-transitory computer-readable recording medium. Hereinafter, the memory device 260c and the external memory device 262 are collectively and simply referred to as a recording medium. The term "recording medium" used herein may indicate a case of including only the memory device 260c, a case of including only the external memory device 262, or a case including both the memory device 260c and the external memory device 262.

(4) Outline of Manufacturing Process of Semiconductor Device

Next, as one process of manufacturing a semiconductor device, a substrate processing process of forming an insulating film on a wafer 200 will be taken as an example and the outline thereof will be described. Here, a case where a silicon nitride (SiN) film as a nitride film is formed as an insulating film will be taken as an example. The substrate processing process described below is performed in the substrate processing system 1000 and the chamber 100 described above. In the following description, the operation of each part is controlled by the controller 260.

FIG. 8 is a flowchart showing the outline of the substrate processing process according to the present embodiment.

(Setting Step: S301)

When processing a substrate, first, a setting step (S301) is performed in the controller 260. In the setting step (S301), the setting of the process information to be applied to the wafer 200 to be processed and the setting of the transfer information corresponding to the process information are performed. The setting of the process information is performed in such a way that, in response to the input of an operation command from the input/output device 261, the CPU 260a selects one of the plural pieces of process information recorded in the memory device 260c, stores the selected process information in the RAM 260b, and sets an operation setting value in each part via the I/O port 260d. The setting of the transfer information will be described later in detail.

(Substrate Loading/Heating Step: S302)

After setting the process information and the transfer information, the wafer 200 is loaded into the chamber 100 in the substrate loading/heating step (S302). The loading of the wafer 200 is performed using the arm 1800 of the vacuum transfer robot 1700. After loading the wafer 200, the vacuum transfer robot 1700 is withdrawn, and the GV 1490 is closed to seal the interior of the chamber 100. Thereafter, the substrate mounting table 212 is moved up to locate the wafer 200 on the substrate mounting surface 211 in the wafer processing position. In this state, the exhaust system is controlled so that the inside of the process chamber 201 has a predetermined pressure, and the heater 213 is controlled so that the surface temperature of the wafer 200 becomes a predetermined temperature.

(Substrate Processing Step: S303)

When a temperature of the wafer 200 located in the wafer processing position reaches a predetermined temperature, a substrate processing step (S303) is subsequently performed. In the substrate processing step (S303), in accordance with the process recipe of the process information set in the setting step (S301), while heating the wafer 200 to a predetermined temperature, the first gas supply part is controlled to supply the first gas to the process chamber 201, and the exhaust system is controlled to exhaust the process chamber 201, thereby performing a process on the wafer 200. At this time, a CVD process may be performed while allowing the second gas to exist in the processing space together with the first gas by controlling the second gas supply part, or a cyclic process may be performed by alternately supplying the first gas and the second gas. In the case of performing a process by converting the second gas into a plasma state, plasma may be generated in the process chamber 201 by using the RPU 124 or by supplying high frequency power to the electrode 244.

As a cyclic process which is one specific example of a substrate processing method, the following method may be considered. For example, there may be a case where a dichlorosilane ($SiH_2Cl_2$, abbreviation: DCS) gas is used as the first gas and an ammonia ($NH_3$) gas is used as the second gas. In that case, the DCS gas is supplied to the wafer 200 in the first step, and the $NH_3$ gas is supplied to the wafer 200 in the second step. Between the first step and the second step, an $N_2$ gas is supplied as a purging step, and the atmosphere of the process chamber 201 is exhausted. A silicon nitride (SiN) film is formed on the wafer 200 by performing the cyclic process that performs the first step, the purging step and the second step a plurality of times.

(Substrate Loading/Unloading Step: S304)

After the predetermined process is performed on the wafer 200, the processed wafer 200 is unloaded from the chamber 100 in the substrate loading/unloading step (S304). The unloading of the processed wafer 200 is performed using the arm 1900 of the vacuum transfer robot 1700.

At this time, when an unprocessed wafer 200 is held on the arm 1800 of the vacuum transfer robot 1700, the loading of the unprocessed wafer 200 into the chamber 100 is performed by the vacuum transfer robot 1700. Then, a substrate processing step (S303) is performed on the wafer 200 held in the chamber 100. When an unprocessed wafer 200 is not held on the arm 1800, the unloading of the processed wafer 200 is only performed.

(Determination Step: S305)

In the substrate processing system 1000, the substrate processing step (S303) and the substrate loading/unloading step (S304) are repeated until there are no unprocessed wafers 200. Then, when there are no unprocessed wafers 200, the series of processes (S301 to S305) described above is ended.

(5) Operation Control of Vacuum Transfer Robot

Next, the operation control of the vacuum transfer robot 1700 in the series of processes described above will be described.

(Overview of Operation Control)

As described above, in the substrate processing step (S303), the wafer 200 is processed by heating up to a predetermined temperature based on the process recipe of the process information. Therefore, a warpage may occur in the processed wafer 200 due to the heating. The amount of the warpage generated in the wafer 200 is affected by the processing temperature, the heating time and the like when processing the wafer 200. The processing temperature, the heating time and the like are defined by the process recipe of the process information. The process information is selectively read from the plural pieces of process information recorded in the memory device 260c and is applied to the process on the wafer 200. Accordingly, the amount of the warpage generated in the wafer 200 may be different according to the content of the applied process information.

Meanwhile, a wafer fixing function such as a vacuum chuck or a mechanical chuck cannot be installed on the tweezers 1801, 1802, 1901 and 1902 of the vacuum transfer robot 1700. Therefore, when the amount of the warpage generated in the wafer 200 is large, there is a possibility that the position shift of the wafer 200 may occur at the time of the transfer due to the decrease in the frictional force caused by the reduction in the contact area with the tweezers 1801, 1802, 1901 and 1902. Although the tweezers 1801, 1802, 1901 and 1902 are provided with pads 1803 and 1903 that implement an anti-slip function using the van der Waals force, the van der Waals force decreases in a high-temperature environment. Therefore, even if the pads 1803 and 1903 are installed, it is impossible to completely eliminate the concern of generation of the position shift of the wafer 200.

Under such circumstances, for example, if only one condition setting can be performed with respect to the operating conditions (the transfer speed, the transfer acceleration, etc.) when the vacuum transfer robot 1700 transfers the wafer 200, regardless of the process content for the wafer 200, it is inevitable to naturally and uniformly set the operating conditions to the low speed conditions. This is to make it possible to suppress the generation of the position shift of the wafer 200 even when the warpage amount of the wafer 200 is large.

However, if the operating conditions of the vacuum transfer robot 1700 are uniformly set to the low speed conditions, even when there is no warpage of the wafer 200 or the amount of warpage is small (i.e., even when the possibility of generation of the position shift of the wafer 200 is low), the wafer 200 is transferred under the low speed conditions. Therefore, it becomes difficult to improve the transfer efficiency of the wafer 200 in the substrate processing system 1000. As a result, the productivity may be lowered in the manufacture of a semiconductor device using the substrate processing system 1000.

Therefore, in the present embodiment, the controller 260, which controls the operation of the vacuum transfer robot 1700, is configured to change the operating conditions of the vacuum transfer robot 1700 at the time of transferring the wafer 200 according to the process content of the wafer 200. More specifically, plural pieces of process information and plural pieces of transfer information are readably recorded in the memory device 260c. The controller 260 controls the operation of the vacuum transfer robot 1700 so as to transfer the wafer 200 based on the transfer information corresponding to the process information applied to the processing of the wafer 200.

That is, in the present embodiment, the processing temperature, the heating time and the like at the time of processing the wafer 200 are different for each process recipe of the process information. Therefore, the transfer information that defines the operating conditions (the transfer speed, the transfer acceleration, etc.) of the vacuum transfer robot 1700 is linked to the process information (particularly, the process recipe) applied to the wafer 200 to be processed. In this way, the operating conditions of the vacuum transfer robot 1700 at the time of transferring the wafer 200 are set according to the process content for the wafer 200. Accordingly, it is possible to variably set the operating conditions of the vacuum transfer robot 1700 while considering the amount of the warpage that may be generated in the wafer 200. As compared with the case where the operating conditions of the vacuum transfer robot 1700 are uniformly set, it is possible to easily suppress the generation of the position shift of the wafer 200 during the transfer and to easily improve the transfer efficiency of the wafer 200.

Hereinafter, a specific control mode of the operation of the vacuum transfer robot 1700 will be described.

(First Control Mode)

First, the first control mode will be described. FIG. 9 is an explanatory view showing an example of the correspondence relationship between the process information and the transfer information in the first control mode. The illustrated example shows a case where film formation of a silicon oxide (SiO) film as an insulating film, for example, as an oxide film is defined, as an example.

For example, there is considered a case where the process recipe of the process information defines that a SiO film is formed at a processing temperature of 150 degrees C. and the wafer 200 is processed based on the process recipe. In that case, if the contact area of the wafer 200 with the tweezers before processing (at the time of loading) is set to "1", there is a possibility that the contact area after processing (at the time of unloading) becomes "0.98" because warpage is generated due to the heating. Therefore, if the operation speed of the vacuum transfer robot 1700 during which the wafer is not mounted thereon is set to "1", it is desirable to suppress the operation speed as "0.8" at the time of loading and the operation speed as "0.75" at the time of unloading in terms of suppressing the generation of position shift of the wafer 200 during the transfer. In view of the foregoing, when the process information (process recipe) for forming a SiO film at the processing temperature of 150 degrees C. is set in the setting step (S301), the transfer recipe of "No. 2" indicative of the operation speed of "0.8" is selected as the transfer information corresponding to the process information at the time of loading, and the transfer recipe of "No. 3" indicative of the operation speed of "0.75" is selected as the transfer information corresponding to the process information at the time of unloading. By setting the transfer information in this way, the vacuum transfer robot 1700 whose operation is controlled based on the transfer information can transfer the wafer 200 without generating the position shift of the wafer 200.

Furthermore, for example, there is considered a case where the process recipe of the process information defines that a SiO film is formed at a processing temperature of 350 degrees C. and the wafer 200 is processed based on the process recipe. In that case, if the contact area of the wafer 200 with the tweezers before processing (at the time of loading) is set to "1", there is a possibility that the contact area after processing (at the time of unloading) becomes "0.7" because warpage is generated due to heating. Therefore, if the operation speed of the vacuum transfer robot 1700 during the non-mounting of the wafer is set to "1", it is desirable to suppress the operation speed as "0.8" at the time of loading and the operation speed as "0.6" at the time of unloading in terms of suppressing the generation of position shift of the wafer 200 during the transfer. In view of the foregoing, when the process information (process recipe) for forming a SiO film at the processing temperature of 350 degrees C. is set in the setting step (S301), the transfer recipe of "No. 2" indicative of the operation speed of "0.8" is selected as the transfer information corresponding to the process information at the time of loading, and the transfer recipe of "No. 4" indicative of the operation speed of "0.6" is selected as the transfer information corresponding to the process information at the time of unloading. By setting the transfer information in this way, the vacuum transfer robot 1700 whose operation is controlled according to the content of the transfer information can transfer the wafer 200 without generating the position shift of the wafer 200.

Furthermore, for example, there is considered a case where the process recipe of the process information defines that a SiO film having a thickness of 2 μm is formed at a processing temperature of 350 degrees C. and the wafer 200 is processed based on the process recipe. In that case, if the contact area of the wafer 200 with the tweezers before processing (at the time of loading) is set to "1", there is a possibility that the contact area after processing (at the time of unloading) becomes "0.6" because warpage is generated due to heating. Therefore, if the operation speed of the vacuum transfer robot 1700 during the non-mounting of the wafer is set to "1", it is preferable to suppress the operation speed as "0.8" at the time of loading and the operation speed as "0.5" at the time of unloading in terms of suppressing the generation of position shift of the wafer 200 during the transfer. In view of the foregoing, when the process information (process recipe) for forming a SiO film having a thickness of 2 μm at the processing temperature of 350 degrees C. is set in the setting step (S301), the transfer recipe of "No. 2" indicative of the operation speed of "0.8" is selected as the transfer information corresponding to the process information at the time of loading, and the transfer recipe of "No. 5" indicative of the operation speed of "0.5" is selected as the transfer information corresponding to the process information at the time of unloading. By setting the transfer information in this way, the vacuum transfer robot 1700 whose operation is controlled according to the content of the transfer information can transfer the wafer 200 without generating the position shift of the wafer 200.

Furthermore, for example, there is considered a case where the process recipe of the process information defines that a SiO film is formed at a processing temperature of 450 degrees C. and the wafer 200 is processed based on the process recipe. In that case, if the contact area of the wafer 200 with the tweezers before processing (at the time of loading) is set to "1", there is a possibility that the contact area after processing (at the time of unloading) becomes "0.5" because warpage is generated due to heating. Therefore, if the operation speed of the vacuum transfer robot 1700 during the non-mounting of the wafer is set to "1", it is preferable to suppress the operation speed as "0.8" at the time of loading and the operation speed as "0.4" at the time of unloading in terms of suppressing the generation of position shift of the wafer 200 during the transfer. In view of the foregoing, when the process information (process recipe) for forming a SiO film at the processing temperature of 450 degrees C. is set in the setting step (S301), the transfer recipe of "No. 2" indicative of the operation speed of "0.8" is selected as the transfer information corresponding to the process information at the time of loading, and the transfer recipe of "No. 6" indicative of the operation speed of "0.4" is selected as the transfer information corresponding to the process information at the time of unloading. By setting the transfer information in this way, the vacuum transfer robot 1700 whose operation is controlled according to the content of the transfer information can transfer the wafer 200 without generating the position shift of the wafer 200.

As described above, in the first control mode, the transfer information that defines the operating conditions of the vacuum transfer robot 1700 at the time of transferring the wafer 200 is set according to the process information that defines the process content of the wafer 200. Therefore, it is possible to variably set the operating conditions of the vacuum transfer robot 1700 while considering the amount of the warpage that may be generated in the wafer 200. In other words, by predicting in advance the amount of the warpage that may be generated in the wafer 200 from the process content for the wafer 200 and by operating the vacuum transfer robot 1700 under the operating conditions that considers the amount of the warpage, the generation of position shift of the wafer 200 during the transfer is suppressed while improving the transfer efficiency of the wafer 200.

In particular, in the first control mode, the vacuum transfer robot 1700 is operated by setting the loading speed at which the wafer 200 is loaded into the chamber 100 and the unloading speed at which the wafer 200 is unloaded from the chamber 100 based on the transfer information corresponding to the process information applied to the wafer 200. That is, the loading speed and the unloading speed are individually set. Therefore, it is possible to more reliably assure the prevention of position shift of the wafer 200 during the transfer and the improvement of the transfer efficiency of the wafer 200.

Specifically, as long as the loading speed and the unloading speed can be individually set, it is possible to set the loading speed and the unloading speed so as to be different from each other. In other words, after the processing (at the time of unloading) in which the wafer 200 may be warped by heating, it is possible to set the speed so as to be lower than the speed before the processing (at the time of loading). If the loading speed is set higher than the unloading speed as described above, it is possible to improve the transfer efficiency by making the loading speed relatively high and it is possible to prevent the position shift of the wafer 200 due to warpage by making the unloading speed relatively low. This makes it possible to further assure the compatibility between the prevention of position shift of the wafer 200 and the improvement of the transfer efficiency.

Further, by individually setting the loading speed and the unloading speed, it is possible to differently set at least the unloading speed according to process information. That is, the amount of warpage of the wafer 200 may vary according to the content of the process information (process recipe). Therefore, if the amount of the warpage that may be generated is small, the unloading speed can be set relatively high, and if the amount of the warpage that may be generated is large, the unloading speed can be set relatively low. If at least the unloading speed is made different according to the process information in this way, the transfer efficiency can be improved when the amount of warpage is small, and the position shift of the wafer 200 can be prevented when the amount of warpage is large. This makes it possible to further assure the compatibility between the prevention of position shift of the wafer 200 and the improvement of the transfer efficiency.

In the present embodiment, the case where the loading speed and the unloading speed are individually set has been taken as an example of the first control mode. However, the present disclosure is not limited to this case. In other words, the first control mode may include not only the case where the loading speed and the unloading speed are individually set but also the case where the loading speed and the unloading speed are uniformly set as the transfer speed. In either case, it is desirable that the operating conditions of the vacuum transfer robot 1700 can be variably set according to the process information. In the present embodiment, the case where the loading speed is set higher than the unloading speed when individually setting the loading speed and the unloading speed has been taken as an example. However, the present disclosure is not limited to this case. For example, the loading speed may be set lower than the unloading speed.

(Second Control Mode)

Next, a second control mode will be described. Differences from the above-described first control mode will be mainly described here. FIG. 10 is an explanatory diagram showing an example of the correspondence relationship between the process recipe and the transfer information in the second control mode.

As described above, the process recipe included in the process information defines the processing temperature, the heating time and the like at the time of processing the wafer 200. That is, the process information includes the processing temperature of the wafer 200 and the heating time for the wafer 200. On the other hand, the magnitude of the amount of warpage generated in the wafer 200 is largely influenced by the processing temperature and the heating time at the time of processing the wafer 200. Therefore, in the second control mode, when setting the operating conditions of the vacuum transfer robot 1700, the selection of the transfer information that is a base of the setting is performed based on the relationship between the processing temperature and the heating time included in the process information. In other words, the case of selecting the transfer information (transfer recipe) according to the processing temperature for the wafer 200 has been mainly described as an example in the above-described first control mode. However, in the second control mode described here, the transfer information (transfer recipe) is selected according to the relationship between the processing temperature and the heating time.

For example, there is considered a case where the process recipe of the process information defines that the processing temperature is 150 degrees C. and the heating time is "10 (arbitrary unit)," and the transfer recipe of "No. 3" is defined as the transfer recipe of the transfer information corresponding to the process recipe. In that case, even if a process in which the processing temperature is set to 150 degrees C. and the heating time is set to "30" is performed on the wafer 200, by selecting the transfer recipe of "No. 3" for the setting, the wafer 200 is transferred at an operating speed which is set in consideration of the amount of warpage that may be generated in the wafer 200.

Furthermore, for example, there is considered a case where the process recipe of the process information defines that the processing temperature is 150 degrees C. and the heating time is "30" which is a relatively long time. In that case, the processing temperature is a relatively low temperature (150 degrees C.). Therefore, even if the heating time extends from "10" to "30", a large change in the amount of warpage that may be generated in the wafer 200 does not occur. Thus, it is assumed that as in the case where the heating time is "10", the transfer recipe of "No. 3" is defined as the transfer recipe of the corresponding transfer information. Accordingly, even if a process in which the processing temperature is set to 150 degrees C. and the heating time is set to "30" is performed on the wafer 200, by selecting the transfer recipe of "No. 3" for the setting, the wafer 200 is transferred at an operating speed which is set in consideration of the amount of warpage that may be generated in the wafer 200.

Furthermore, for example, there is considered a case where the process recipe of the process information defines that the processing temperature is 350 degrees C. and the heating time is "5". In that case, even if the processing temperature is a relatively high temperature (350 degrees C.), the heating time is a relatively short time ("5"). Therefore, large warpage is not generated in the wafer 200. Thus, it is assumed that the transfer recipe of "No. 2" is defined as the transfer recipe of the corresponding transfer information. Accordingly, even if a process in which the processing temperature is set to 350 degrees C. and the heating time is set to "5" is performed on the wafer 200, by selecting the transfer recipe of "No. 2" for the setting, the wafer 200 is transferred at an operating speed which is set in consideration of the amount of warpage that may be generated in the wafer 200.

Furthermore, for example, there is considered a case where the process recipe of the process information defines that the processing temperature is 350 degrees C. and the heating time is "30" which is a relatively long time. In that case, the processing temperature is a relatively high temperature (350 degrees C.). Therefore, if the heating time extends from "5" to "30", the amount of warpage that may be generated in the wafer 200 increases. Thus, it is assumed that the transfer recipe of "No. 4" is defined as the transfer recipe of the corresponding transfer information. Accordingly, even if a process in which the processing temperature is set to 350 degrees C. and the heating time is set to "30" is performed on the wafer 200, by selecting the transfer recipe of "No. 4" for the setting, the wafer 200 is transferred at an operating speed which is set in consideration of the amount of warpage that may be generated in the wafer 200.

Furthermore, for example, there is considered a case where the process recipe of the process information defines that the processing temperature is 450 degrees C. and the heating time is "5". In that case, even if the processing temperature is a higher temperature (450 degrees C.), the heating time is a relatively short time ("5"). Therefore, large warpage is not generated in the wafer 200. Thus, it is assumed that the transfer recipe of "No. 2" is defined as the transfer recipe of the corresponding transfer information. Accordingly, even if a process in which the processing temperature is set to 450 degrees C. and the heating time is set to "5" is performed on the wafer 200, by selecting the transfer recipe of "No. 2" for the setting, the wafer 200 is transferred at an operating speed which is set in consideration of the amount of warpage that may be generated in the wafer 200.

Furthermore, for example, there is considered a case where the process recipe of the process information defines that the processing temperature is 450 degrees C. and the heating time is "30" which is a relatively long time. In that case, the processing temperature is a higher temperature (450 degrees C.). Therefore, if the heating time extends from "5" to "30", the amount of warpage that may be generated in the wafer 200 further increases. Thus, it is assumed that the transfer recipe of "No. 6" is defined as the transfer recipe of the corresponding transfer information. Accordingly, even if a process in which the processing temperature is set to 450 degrees C. and the heating time is set to "30" is performed on the wafer 200, by selecting the transfer recipe of "No. 6" for the setting, the wafer 200 is transferred at an operating speed which is set in consideration of the amount of warpage that may be generated in the wafer 200.

As described above, in the second control mode, the transfer information (transfer recipe) that defines the operating conditions of the vacuum transfer robot 1700 at the time of transferring the wafer 200 is set according to the relationship between the processing temperature and the heating time included in the process information. Since the relationship between the processing temperature and the heating time for the wafer 200 is used as a base in this way, the magnitude of the amount of warpage that may be generated in the wafer 200 can be more accurately estimated as compared with the case where only the processing temperature is used as a basis. Accordingly, if the operating conditions of the vacuum transfer robot 1700 are variably set based on the relationship between the processing temperature and the heating time, it is very effective in suppressing the generation of position shift of the wafer 200 during the transfer while improving the transfer efficiency of the wafer 200.

(Third Control Mode)

Next, a third control mode will be described. Differences from the above-described first control mode or second control mode will be mainly described here.

As described above, the temperature sensors 701*a* to 701*j* are installed in the TM 1400 in which the vacuum transfer robot 1700 is installed, so that it is possible to measure the temperature of the wafer 200 during the transfer. Therefore, in the third control mode, when setting the operating conditions of the vacuum transfer robot 1700, the selection of the transfer information that is a base of the setting is performed based on the temperature measurement result for the wafer 200 obtained by the temperature sensors 701*a* to 701*j*, in addition to the process information. This is because the temperature of the wafer 200 may drop during the period from the end of the substrate processing step (S303) to the start of the substrate loading/unloading step (S304).

Specifically, first, as in the case of the first or second control mode, the transfer information is set according to the process information and the vacuum transfer robot 1700 is operated according to the transfer information. Then, the temperature measurement result for the wafer 200 transferred by the vacuum transfer robot 1700 is acquired by using any one of the temperature sensors 701*a* to 701*j*. At this time, if the difference between the temperature measurement result and the processing temperature defined by the process information falls within a predetermined allowable range, the vacuum transfer robot 1700 continuously transfers the wafers 200 while maintaining the operating conditions set as above.

However, if the difference between the temperature measurement result and the processing temperature does not fall within the predetermined allowable range, it is considered that a deviation exists between the warpage amount of the wafer 200 that can be inferred from the process information and the warpage amount of the wafer 200 actually generated. Therefore, the setting of the operating conditions of the vacuum transfer robot 1700 is corrected. For example, when the temperature measurement result is lower than the processing temperature to such an extent as to exceed the allowable range, it is considered that the actually generated warpage amount of the wafer 200 is smaller than an expected warpage amount. Therefore, the selection and setting of the transfer information are corrected so as to re-select the transfer information that defines a higher transfer speed. The re-selection of the transfer information may be performed based on the table, the relational expression and other correspondence information, which are recorded in the memory device 260*c* in advance.

As described above, in the third control mode, the corresponding transfer information is selected based on the temperature measurement result for the wafer 200 obtained by the temperature sensors 701*a* to 701*j*, in addition to the process information. Therefore, it is possible to operate the vacuum transfer robot 1700 under the operating conditions considering the actually generated warpage amount of the wafer 200. This is very effective in suppressing the generation of position shift of the wafer 200 during the transfer while improving the transfer efficiency of the wafer 200.

(Fourth Control Mode)

Next, a fourth control mode will be described. Differences from the above-described third control mode will be mainly described here.

As described above, the temperature sensors 701*a* to 701*j* installed in the TM 1400 can measure the temperatures of the tweezers 1801, 1802, 1901 and 1902 of the respective arms 1800 and 1900 of the vacuum transfer robot 1700 as well as the temperature of the wafer 200. Therefore, in the fourth control mode, when setting the operating conditions of the vacuum transfer robot 1700, the selection of the transfer information that is a base of the setting is performed based on one or both of the temperature measurement result of the wafer 200 and the temperature measurement results of the tweezers 1801, 1802, 1901 and 1902 obtained by the temperature sensors 701*a* to 701*j*, in addition to the process information.

For example, in the fourth control mode, the selection and the setting of the transfer information that is a base of the operating conditions of the vacuum transfer robot 1700 are collected based on the temperature measurement results for the tweezers 1801, 1802, 1901 and 1902 obtained by the temperature sensors 701*a* to 701*j*, instead of the temperature measurement result for the wafer 200 described in the third control mode. This is because the temperatures of the tweezers 1801, 1802, 1901 and 1902 have a direct influence on the temperature of the wafer 200 to be transferred.

Furthermore, for example, in the fourth control mode, both the temperature measurement result for the wafer 200 and the temperature measurement result for the tweezers 1801, 1802, 1901 and 1902 may be acquired, and the selection and the setting of the transfer information may be corrected based on the relationship therebetween. When a large number of wafers 200 are continuously processed, the temperature of the tweezers 1801, 1802, 1901 and 1902 is changed (increased) and is kept in a high temperature state. This may influence on the degree of temperature change (particularly, cooling) of the wafer 200.

As described above, in the fourth control mode, the selection of the corresponding transfer information is performed based on one or both of the temperature measurement result for the wafer 200 and the temperature measurement result for the tweezers 1801, 1802, 1901 and 1902 obtained by the temperature sensors 701a to 701j, in addition to the process information. Therefore, it is possible to operate the vacuum transfer robot 1700 under the operating conditions which are set in consideration of the amount of warpage of the wafer 200, while considering the influence of the temperatures of the tweezers 1801, 1802, 1901 and 1902 on the temperature of the wafer 200. This is very effective in suppressing the generation of position shift of the wafer 200 during transfer while improving the transfer efficiency of the wafer 200.

(Fifth Control Mode)

Next, a fifth control mode will be described. Differences from the above-described first to fourth control modes will be mainly described here.

In any of the first to fourth control modes, as the operating conditions of the vacuum transfer robot 1700, the case where the speed at which the wafer 200 is transferred by the vacuum transfer robot 1700 is variably set has been taken as an example. On the other hand, in the fifth control mode, the operation of the vacuum transfer robot 1700 is controlled by variably setting the acceleration at the time of transferring the wafer 200 by the vacuum transfer robot 1700 in place of or in addition to the transfer speed of the wafer 200. This is because the presence or absence of position shift of the wafer 200 during the transfer can be influenced by the magnitude of the acceleration at the time of operating the vacuum transfer robot 1700.

Specifically, for example, when it is assumed that the amount of warpage of the wafer 200 is large, the acceleration at the time of operating the vacuum transfer robot 1700 is controlled to be small. Furthermore, for example, when it is assumed that the amount of warpage of the wafer 200 is small, the acceleration at the time of operating the vacuum transfer robot 1700 is increased so as to promptly reach a desired transfer speed.

As described above, in the fifth control mode, when selecting the transfer information that is a base of the operating conditions of the vacuum transfer robot 1700, the acceleration at the time of operating the vacuum transfer robot 1700 is controlled based on the acceleration parameter in the selected transfer information. Therefore, it is possible to operate the vacuum transfer robot 1700 at the acceleration which takes the amount of warpage that may be generated in the wafer 200 into consideration. This is very effective in suppressing the generation of position shift of the wafer 200 during the transfer while improving the transfer efficiency of the wafer 200.

(Sixth Control Mode)

Next, a sixth control mode will be described. Differences from the above-described first to fifth control modes will be mainly described here.

As described above, the vacuum transfer robot 1700 is configured to be able to simultaneously transfer two wafers 200 with one arm. Further, since the PMs 110a to 110d are connected to the TM 1400, the vacuum transfer robot 1700 is configured so as to be able to perform a turning motion for loading and unloading the wafer 200 into and from each of the PMs 110a to 110d. That is, the vacuum transfer robot 1700 is configured to be able to support a plurality of wafers 200 and is configured to be able to perform a turning motion within the TM 1400. Therefore, for example, when the vacuum transfer robot 1700 performs a turning motion in a state of supporting a plurality of wafers 200, the rotation center position of the turning motion and the support position of each wafer 200 are moved away from each other, and thus the centrifugal force generated by the turning motion is applied to each wafer 200, whereby there is a possibility that position shift is generated in each wafer 200.

Therefore, in the sixth control mode, when setting the operating conditions of the vacuum transfer robot 1700, the selection of the transfer information that is a base of the setting is performed based on the number of wafers 200 supported by the vacuum transfer robot 1700. It is assumed that the number of wafers 200 is defined, for example, by the process information.

More specifically, for example, when the number of wafers 200 supported by the vacuum transfer robot 1700 is only one, the arm movement is controlled such that the support position of the wafer 200 coincides with the rotation center position of the turning motion. As a result, the possibility of generation of position shift due to the application of a centrifugal force can be reduced so that at least one of the angular velocity and the acceleration at the time of performing the turning motion is increased to an allowable degree. On the other hand, for example, when the vacuum transfer robot 1700 simultaneously supports a plurality of wafers 200, it is impossible to match the support position of each wafer 200 and the rotation center position of the turning motion. Thus, at least one of the angular velocity and the acceleration at the time of performing the turning motion is suppressed to become small.

As described above, in the sixth control mode, it is controlled to change the turning condition at the time of operating the vacuum transfer robot 1700 according to the number of wafers 200 supported by the vacuum transfer robot 1700. The turning condition referred to herein includes the content of the arm movement when a turning motion is performed in the vacuum transfer robot 1700 and at least one of the angular velocity and the acceleration during the turning motion. By thus controlling the turning motion of the vacuum transfer robot 1700, it is possible to eliminate the influence of the centrifugal force generated by the turning motion. This is very effective in suppressing the generation of position shift of the wafer 200 during transfer while improving the transfer efficiency of the wafer 200.

(Seventh Control Mode)

Next, a seventh control mode will be described. Differences from the above-described first to sixth control modes will be mainly described here.

In the seventh control mode, the CPU 260a as the operation part in the controller 260 extracts the operation information of the vacuum transfer robot 1700. Examples of the operation information include information indicative of the cumulative number of wafers 200 transferred by the vacuum transfer robot 1700 or information indicative of the number of wafers 200 transferred per unit time. However, the operation information is not limited to these pieces of information but may be other information as long as it specifies the operation status of the vacuum transfer robot 1700. After extracting the operation information of the vacuum transfer robot 1700, in the seventh control mode, when setting the operating conditions of the vacuum transfer robot 1700, the selection of the transfer information that is a base of the setting is performed based on the extracted operation information, in addition to the process information.

Specifically, for example, there is considered a case where continuous processing (transfer) of 100 or more wafers 200 is extracted as operation information. In that case, it is inferred that heat exchange between the tweezers of the vacuum transfer robot 1700 and the respective wafers 200 occurs due to the continuous processing of the wafers 200, whereby the tweezers are heated to a high temperature. If the tweezers are heated to a high temperature, the temperature difference between the tweezers and the wafer 200 becomes small. Therefore, even if the wafer 200 is supported by the tweezers, an increase in warpage amount of the wafer 200 is suppressed. Accordingly, even if the speed or the acceleration at the time of transferring the wafer 200 is set to be large, it is possible to suppress the generation of position shift of the wafer 200 during the transfer.

Furthermore, for example, there is considered a case where the transfer of about 1 to 25 wafers 200 from the start of operation is extracted as the operation information. In that case, it is inferred that immediately after the start of an operation, the tweezers are kept in a state close to a room temperature. If the tweezers are kept at a room temperature, the temperature difference between the tweezers and the wafer 200 is large. Therefore, if the wafer 200 is supported by the tweezers, there is a possibility that the warpage of the wafer 200 may increase due to the temperature difference between the tweezers and the wafer 200. Accordingly, by setting the speed or the acceleration at the time of transferring the wafer 200 to become small, it is possible to suppress the generation of position shift of the wafer 200 during transfer.

As described above, in the seventh control mode, after extracting the operation information of the vacuum transfer robot 1700, the selection of the corresponding transfer information is performed based on the extracted operation information, in addition to the process information. Accordingly, it is possible to operate the vacuum transfer robot 1700 under the operating conditions which take the amount of warpage that may be generated in the wafer 200 into consideration, while taking the influence of the operation status of the vacuum transfer robot 1700 into account. This is very effective in suppressing the generation of position shift of the wafer 200 during the transfer while improving the transfer efficiency of the wafer 200.

(Eighth Control Mode)

Next, an eighth control mode will be described. Differences from the above-described first to seventh control modes will be mainly described here.

In the eighth control mode, the temperatures of the tweezers 1801, 1802, 1901 and 1902 of the vacuum transfer robot 1700 are measured by the temperature sensors 701a to 701j. If the temperature measurement result falls within a predetermined temperature range, the tweezers 1801, 1802, 1901 and 1902 are cooled.

Specifically, for example, the operation of the vacuum transfer robot 1700 is controlled such that the tweezers 1801, 1802, 1901 and 1902, which need to be cooled, are brought close to the gas supply pipes 501a and 502a of the L/L chamber 1300. The cooling of the tweezers 1801, 1802, 1901 and 1902 is performed by the inert gas supplied from the gas supply pipes 501a and 502a. That is, the inert gas supply part including the gas supply pipes 501a and 502a is caused to function as a cooling part for cooling the tweezers 1801, 1802, 1901 and 1902.

In addition, for example, the operation of the vacuum transfer robot 1700 may be controlled such that the tweezers 1801, 1802, 1901 and 1902, which need to be cooled, are brought close to the cooling parts 801a and 801b in the L/L chamber 1300. In this case, the tweezers 1801, 1802, 1901 and 1902 are cooled by the coolant supplied to the coolant passages 802a and 802b. That is, the cooling parts 801a and 801b in the L/L chamber 1300 are caused to function as cooling parts for cooling the tweezers 1801, 1802, 1901 and 1902.

As described above, in the eighth control mode, if the temperature measurement results of the tweezers 1801, 1802, 1901 and 1902 obtained by the temperature sensors 701a to 701j fall within a predetermined temperature range, the cooling of the tweezers 1801, 1802, 1901 and 1902 is performed. By performing the cooling as necessary, it is possible to appropriately control the temperatures of the tweezers 1801, 1802, 1901 and 1902. Therefore, for example, even if the temperatures of the tweezers 1801, 1802, 1901 and 1902 become high and the van der Waals force generated by the pads 1803 and 1903 decreases, it is possible to restore the van der Waals force by the cooling and to suppress the generation of position shift of the wafer 200. Furthermore, for example, by controlling the temperatures of the tweezers 1801, 1802, 1901 and 1902, it is possible to cause the temperature difference between the tweezers and the wafer 200 to fall within a desired range and to suppress the generation of position shift of the wafer 200 due to the temperature difference. That is, by making it possible to cool the tweezers 1801, 1802, 1901 and 1902 as necessary, it is very effective in suppressing the generation of position shift of the wafer 200 during the transfer while improving the transfer efficiency of the wafer 200.

In the eighth control mode, the case where the temperatures of the tweezers 1801, 1802, 1901 and 1902 are measured by the temperature sensors 701a to 701j has been taken as an example. However, the present disclosure is not limited thereto. For example, the operation information of the vacuum transfer robot 1700 may be extracted as described in the seventh control mode, and the temperatures of the tweezers 1801, 1802, 1901 and 1902 may be estimated from the operation information.

(6) Effect of the Present Embodiment

According to the present embodiment, one or more of the following effects may be achieved.

(a) In one control mode described in the present embodiment, the operation of the vacuum transfer robot 1700 that transfers the wafer 200 is controlled based on the transfer information corresponding to the process information applied to the wafer 200. Therefore, it is possible to variably set the operating conditions of the vacuum transfer robot 1700 while taking the warpage amount of the wafer 200 estimated from the content of the process information into consideration. In other words, by operating the vacuum transfer robot 1700 under the operating conditions which take the amount of warpage that may be generated in the wafer 200 into account, it is possible to suppress the generation of position shift of the wafer 200 during the transfer while improving the transfer efficiency of the wafer 200 and to optimize the transfer of the wafer 200 by the vacuum transfer robot 1700.

(b) In one control mode described in the present embodiment, the loading speed and the unloading speed for the wafer 200 are separately set based on the transfer information corresponding to the process information applied to the wafer 200 to operate the vacuum transfer robot 1700. Therefore, it is possible to set the loading speed and the unloading speed so as to be different from each other, or to set at least the loading speed so as to be different according to the process information. This makes it possible to further assure the prevention of position shift of the wafer 200 during the transfer and the improvement of the transfer efficiency of the wafer 200.

(c) In one control mode described in the present embodiment, the selection and the setting of the transfer information corresponding to the process information are performed based on the relationship between the processing temperature and the heating time included in the process information. By using the relationship between the processing temperature and the heating time for the wafer 200 as a base in this way, the magnitude of the amount of warpage that may be generated in the wafer 200 can be more accurately estimated as compared with the case where only the processing temperature is used as a basis. Accordingly, if the operating conditions of the vacuum transfer robot 1700 are variably set based on the relationship between the processing temperature and the heating time, it is very effective in suppressing the generation of position shift of the wafer 200 during transfer while improving the transfer efficiency of the wafer 200.

(d) In one control mode described in the present embodiment, the selection of the transfer information for operating the vacuum transfer robot 1700 that transfers the wafer 200 is performed based on the temperature measurement result of the wafer 200 obtained by the temperature sensors 701a to 701j, in addition to the process information. Accordingly, it is possible to operate the vacuum transfer robot 1700 under the operating conditions considering the amount of warpage of the wafer 200 that may be actually generated. This is very effective in suppressing the generation of position shift of the wafer 200 during transfer while improving the transfer efficiency of the wafer 200.

(e) In one control mode described in the present embodiment, the selection of the transfer information for operating the vacuum transfer robot 1700 that transfers the wafer 200 is performed based on one or both of the temperature measurement result for the wafer 200 and the temperature measurement result of the tweezers 1801, 1802, 1901 and 1902 obtained by the temperature sensors 701a to 701j, in addition to the process information. Accordingly, it is possible to operate the vacuum transfer robot 1700 under the operating conditions which are set in consideration of the amount of warpage of the wafer 200, while taking the influence of the temperatures of the tweezers 1801, 1802, 1901 and 1902 on the temperature of the wafer 200 into consideration. This is very effective in suppressing the generation of position shift of the wafer 200 during transfer while improving the transfer efficiency of the wafer 200.

(f) In one control mode described in the present embodiment, the operation of the vacuum transfer robot 1700 is controlled by variably setting the acceleration at the time of transferring the wafer 200 with the vacuum transfer robot 1700 in place of or in addition to the transfer speed of the wafer 200. Accordingly, it is possible to operate the vacuum transfer robot 1700 at the acceleration which takes the amount of warpage that may be generated in the wafer 200 into account. This is very effective in suppressing the generation of position shift of the wafer 200 during transfer while improving the transfer efficiency of the wafer 200.

(g) In one control mode described in the present embodiment, it is controlled to change the turning condition at the time of operating the vacuum transfer robot 1700 according to the number of wafers 200 supported by the vacuum transfer robot 1700. Accordingly, it is possible to eliminate the influence of the centrifugal force generated by the turning motion of the vacuum transfer robot 1700 on the wafer 200. This is very effective in suppressing the generation of position shift of the wafer 200 during transfer while improving the transfer efficiency of the wafer 200.

(h) In one control mode described in this embodiment, the selection of the transfer information for operating the vacuum transfer robot 1700 is performed based on the operation information of the vacuum transfer robot 1700, in addition to the process information. Accordingly, it is possible to operate the vacuum transfer robot 1700 under the operating conditions considering the amount of warpage that may be generated in the wafer 200, while taking the influence of the operation status of the vacuum transfer robot 1700 into account. This is very effective in suppressing the generation of position shift of the wafer 200 during transfer while improving the transfer efficiency of the wafer 200.

(i) In one control mode described in the present embodiment, the cooling of the tweezers 1801, 1802, 1901 and 1902 can be performed as necessary based on the temperature measurement result of the tweezers 1801, 1802, 1901 and 1902 obtained by the temperature sensors 701a to 701j. Accordingly, for example, it is possible to restore the van der Waals force generated by the pads 1803 and 1903 and to keep the temperature difference from the wafer 200 within a desired range. This is very effective in suppressing the generation of position shift of the wafer 200 during transfer while improving the transfer efficiency of the wafer 200.

OTHER EMBODIMENTS

While one embodiment of the present disclosure has been concretely described above, the present disclosure is not limited to the above-described embodiment, and various modifications may be made without departing from the spirit thereof.

For example, in the above-described embodiment, there has been described the method in which the first gas and the second gas are alternately supplied to form a film. However, other methods are also applicable. For example, the supply timing of the first gas and the supply timing of the second gas may be overlapped with each other.

Furthermore, for example, in the above-described embodiment, there has been described the method in which a process is performed by supplying two kinds of gases. However, a process may be performed using one kind of gas.

Further, for example, in the above-described embodiment, the film-forming process has been described. However, the present disclosure is also applicable to other processes. Examples thereof include a diffusion process using plasma, an oxidation process, a nitriding process, an oxynitriding process, a reduction process, an oxidation reduction process, an etching process, a heating process, and the like. Moreover, for example, the present disclosure may also be applied to a plasma oxidation process or a plasma nitriding process of a substrate surface or a film formed on a substrate using only a reaction gas. In addition, the present disclosure may be applied to a plasma annealing process using only a reactant gas. These processes may be performed as a first process and then the second process described above may be performed.

Further, for example, in the above-described embodiment, there has been described the manufacturing process of the semiconductor device. However, the present disclosure may be applied to processes other than the manufacturing process of the semiconductor device. For example, the present disclosure may be applied to substrate processing such as a manufacturing process of a liquid crystal device, a manufacturing process of a solar cell, a manufacturing process of a light-emitting device, a processing process of a glass substrate, a processing process of a ceramic substrate, a processing process of a conductive substrate, and the like.

Moreover, for example, in the above-described embodiment, there has been described the example in which a silicon nitride film is formed by using a silicon-containing gas as a precursor gas and using a nitrogen-containing gas as a reaction gas. However, the present disclosure may also be applied to film formation using other gases. For example, the present disclosure may be applied to formation of an oxygen-containing film, a nitrogen-containing film, a carbon-containing film, a boron-containing film, a metal-containing film and combinations thereof. Examples of these films include an AlO film, a ZrO film, a HfO film, a HfAlO film, a ZrAlO film, a SiC film, a SiCN film, a SiBN film, a TiN film, a TiC film, a TiAlC film and the like.

In addition, for example, in the above-described embodiment, there has been described the apparatus configuration for processing one substrate in one process chamber. However, the present disclosure is not limited thereto but may be applied to an apparatus in which a plurality of substrates is arranged in the horizontal direction or the vertical direction.

According to the technique of the present disclosure, it is possible to realize the proper transfer of a substrate by a transfer robot.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) heating and processing a substrate in a process chamber based on process information;
   (b) transferring the substrate between the process chamber and a load lock chamber connected to a vacuum transfer chamber by a transfer robot installed in the vacuum transfer chamber connected to the process chamber; and
   (c) reading transfer information, which corresponds to the process information applied to the substrate in (a), from a memory device in which plural pieces of the process information on a process content of the substrate and plural pieces of the transfer information of the transfer robot corresponding to the plural pieces of the process information are recorded, and controlling the transfer robot to transfer the substrate based on the read transfer information.

2. The method of claim 1, wherein a loading speed of the substrate at the time of loading the substrate into the process chamber and an unloading speed of the substrate at the time of unloading the substrate from the process chamber are set based on the transfer information, in (c).

3. The method of claim 2, wherein the loading speed before the processing in the process chamber and the unloading speed after the processing in the process chamber are set differently from each other, in (c).

4. The method of claim 3, wherein at least the unloading speed is differently set according to the process information applied to the substrate, in (c).

5. The method of claim 4, wherein the process information recorded in the memory device includes a processing temperature of the substrate and a heating time of the substrate and the corresponding transfer information is selected based on the relationship between the processing temperature and the heating time, in (c).

6. The method of claim 5, wherein the corresponding transfer information is selected based on a temperature of the substrate in addition to the process information, in (c).

7. The method of claim 6, wherein a temperature of tweezers of the transfer robot is measured, and the corresponding transfer information is selected based on one or both of the temperature of the substrate and the temperature of the tweezers in addition to the process information, in (c).

8. The method of claim 7, further comprising cooling the tweezers when the temperature of the tweezers falls within a predetermined temperature range.

9. The method of claim 4, wherein the corresponding transfer information is selected based on a temperature of the substrate in addition to the process information, in (c).

10. The method of claim 3, wherein the process information recorded in the memory device includes a processing temperature of the substrate and a heating time of the substrate and the corresponding transfer information is selected based on the relationship between the processing temperature and the heating time, in (c).

11. The method of claim 3, wherein the corresponding transfer information is selected based on a temperature of the substrate in addition to the process information, in (c).

12. The method of claim 2, wherein at least the unloading speed is differently set according to the process information applied to the substrate, in (c).

13. The method of claim 2, wherein the process information recorded in the memory device includes a processing temperature of the substrate and a heating time of the substrate and the corresponding transfer information is selected based on a relationship between the processing temperature and the heating time, in (c).

14. The method of claim 2, wherein the corresponding transfer information is selected based on a temperature of the substrate in addition to the process information, in (c).

15. The method of claim 1, wherein the process information recorded in the memory device includes a processing temperature of the substrate and a heating time of the substrate and the corresponding transfer information is selected based on a relationship between the processing temperature and the heating time, in (c).

16. The method of claim 1, wherein the corresponding transfer information is selected based on a temperature of the substrate in addition to the process information, in (c).

17. The method of claim 1, wherein acceleration at the time of operating the transfer robot is controlled according to an acceleration parameter in the read transfer information, in (c).

18. The method of claim 1, wherein the corresponding transfer information is selected to be read based on operation information of the transfer robot in addition to the process information, in (c).

* * * * *